United States Patent [19]
Sato et al.

[11] Patent Number: 5,371,430
[45] Date of Patent: Dec. 6, 1994

[54] PIEZOELECTRIC TRANSFORMER PRODUCING AN OUTPUT A.C. VOLTAGE WITH REDUCED DISTORTION

[75] Inventors: Masuji Sato; Noboru Wakatsuki; Masanori Ueda; Hiroshi Hasegawa, all of Kawasaki, Japan

[73] Assignee: Fujitsu Limited, Kawasaki, Japan

[21] Appl. No.: 57,500

[22] Filed: May 6, 1993

Related U.S. Application Data

[63] Continuation-in-part of Ser. No. 834,360, Feb. 12, 1992, abandoned.

[30] Foreign Application Priority Data

| Feb. 12, 1991 | [JP] | Japan | 3-018549 |
| Nov. 8, 1991 | [JP] | Japan | 3-292753 |
| Dec. 5, 1991 | [JP] | Japan | 3-322146 |
| Dec. 9, 1991 | [JP] | Japan | 3-324805 |
| May 6, 1992 | [JP] | Japan | 4-158489 |

[51] Int. Cl.$^5$ .................................... H01L 41/08
[52] U.S. Cl. ............................ 310/359; 310/366
[58] Field of Search ............ 310/358, 359, 365, 366, 310/334

[56] References Cited

U.S. PATENT DOCUMENTS

| 2,194,539 | 3/1940 | Barry et al. | 310/366 |
| 2,323,610 | 7/1943 | Koch | 310/366 |
| 3,334,307 | 8/1967 | Blum | 310/334 |
| 3,343,105 | 9/1967 | Van Der Pauw | 310/334 |
| 3,487,239 | 12/1969 | Schafft | 310/359 |
| 3,537,039 | 10/1970 | Schafft | 310/359 |
| 3,657,578 | 4/1972 | Inoue | 310/359 |
| 3,680,009 | 7/1972 | Slobodnik, Jr. | 310/313 A |
| 3,736,446 | 5/1973 | Berlincourt et al. | 310/359 |
| 3,764,848 | 10/1973 | Berlincourt | 315/55 |
| 3,790,826 | 2/1974 | Kawada | 310/339 |
| 4,419,598 | 12/1983 | Spitz et al. | 310/311 |
| 4,581,556 | 4/1986 | Yamamoto | 310/320 |
| 4,604,543 | 8/1986 | Umemura et al. | 310/334 |
| 4,692,654 | 9/1987 | Umemura et al. | 310/334 |
| 5,229,680 | 7/1993 | Sato et al. | 310/339 |

FOREIGN PATENT DOCUMENTS

| 3927406 | 2/1991 | Germany | H01L 41/10 |
| 45-11715 | 5/1970 | Japan | |
| 0083274 | 6/1980 | Japan | 310/359 |
| 0089281 | 6/1982 | Japan | 310/359 |
| 57-89281 | 6/1982 | Japan | H01L 41/08 |
| 60-72311 | 4/1985 | Japan | H03H 9/19 |
| 636716 | 12/1978 | U.S.S.R. | H01L 41/08 |

OTHER PUBLICATIONS

Patent Abstracts of Japan, vol. 6, No. 247 (E-146) Dec. 7, 1982 & JP-A-57 147288 (Nippon Denki KK) Sep. 11, 1982.

Patent Abstracts of Japan, vol. 12, No. 486 (E-695) Dec. 19, 1988 & JP-A-63 200579 (NGK Spark Plub Co) Aug. 18, 1988.

K. Nakamura et al., "Piezoelectric Transformers Using Single Crystals of LiNbO$_3$," published on Mar. 28, 1990, pp. 687–688.

P. A. van Berkum et al., "High Voltage Ceramic Transformers," IRE Transactions of BTR, 8-1, 1962–03, pp. 22–35.

H. Tominaga et al., "Devices Using High–Coupling Piezoelectric Crystals," Fujitsu Sci. Tech. J., 24, 2, Jun. 1988, pp. 71–99.

H. Watanabe et al., "Energy Trapping of Higher–Harmonic Width Vibrations in Piezoelectric Strips and Its Application to Filters," Trans IEICE, vol. J71-A, No. 8, Aug. 1988, pp. 1489–1498.

Primary Examiner—Thomas M. Dougherty
Attorney, Agent, or Firm—Staas & Halsey

[57] ABSTRACT

A piezoelectric transformer comprises a piezoelectric substrate carrying thereon an input electrode structure provided on an upper major surface of the piezoelectric substrate for receiving an a.c. voltage for causing an excitation of an elastic wave in the substrate such that the elastic wave propagates through the substrate in a longitudinal direction, an output electrode structure provided on a lower major surface of the piezoelectric substrate for producing an output a.c. voltage by converting the elastic wave into an electric voltage, wherein the input electrode structure and the output electrode structure have a periodical structure in the longitudinal direction with a pitch corresponding to a wavelength of the elastic wave, and wherein at least one of the first and second electrode structures extend in the longitudinal direction from the first longitudinal edge to the second longitudinal edge substantially continuously.

10 Claims, 48 Drawing Sheets

F I G. 15
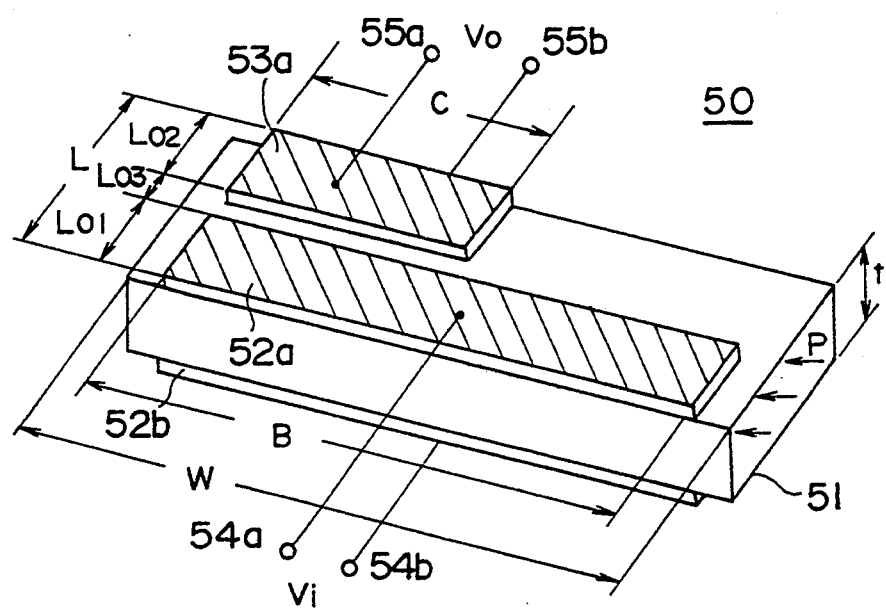

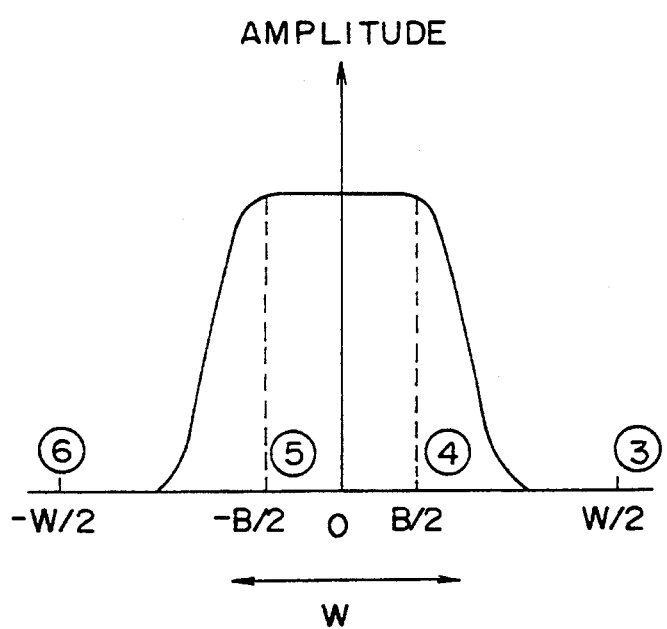

F I G. 29
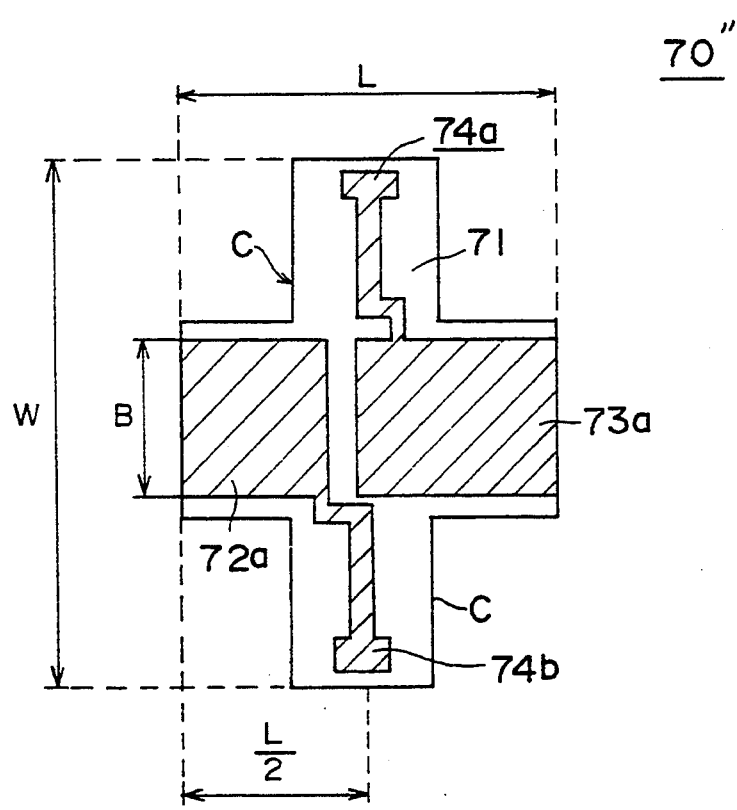

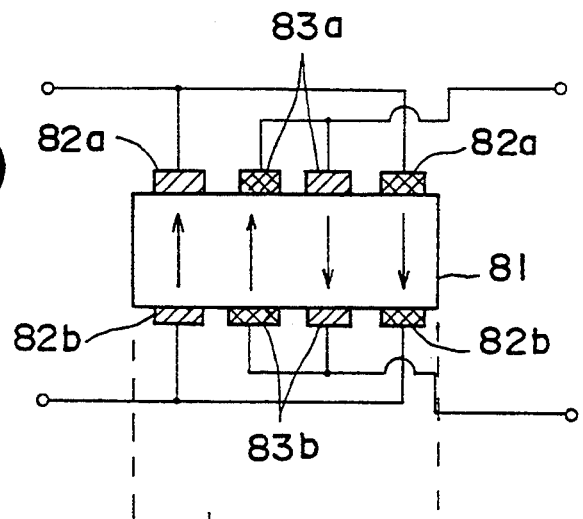
FIG.32(A)
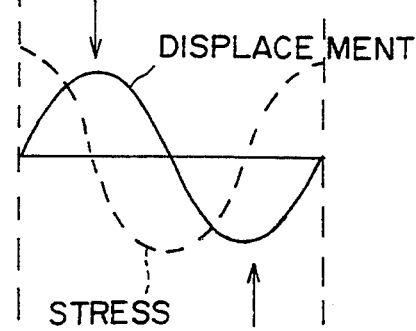
FIG.32(B)
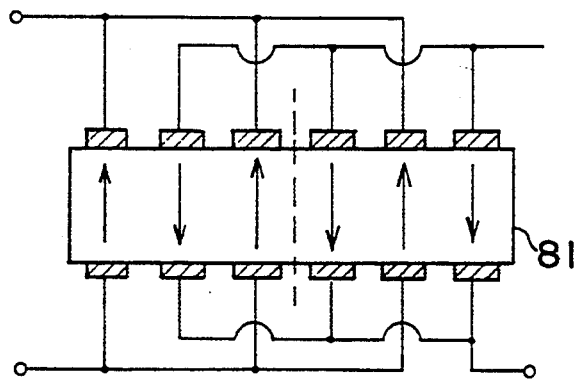
FIG.32(C)
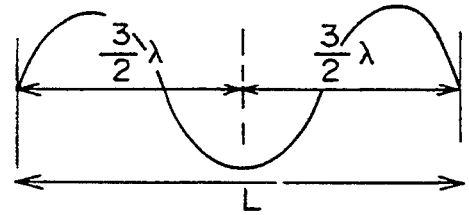

FIG. 36(A)
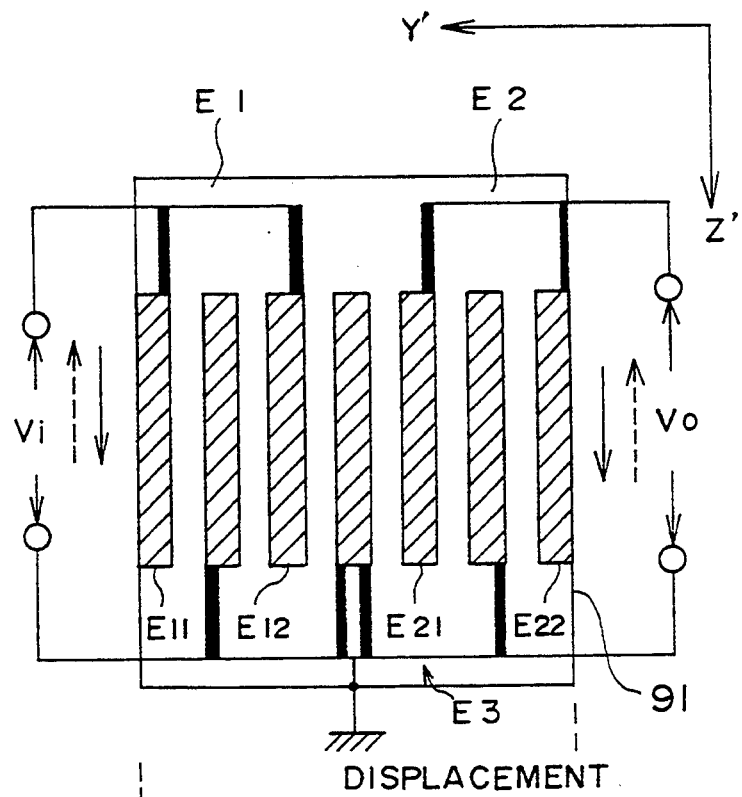
FIG.36(B)
FIG.36(C)
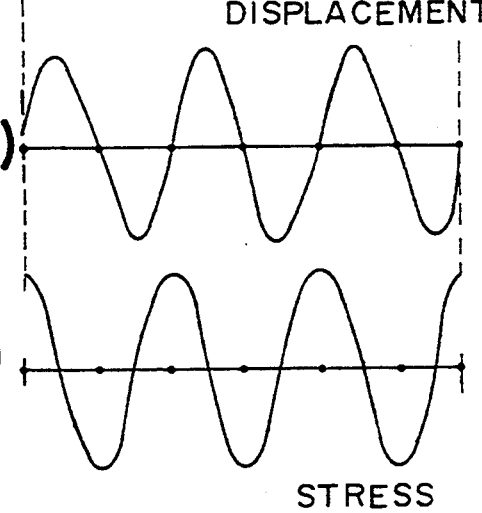

F I G. 38(A)
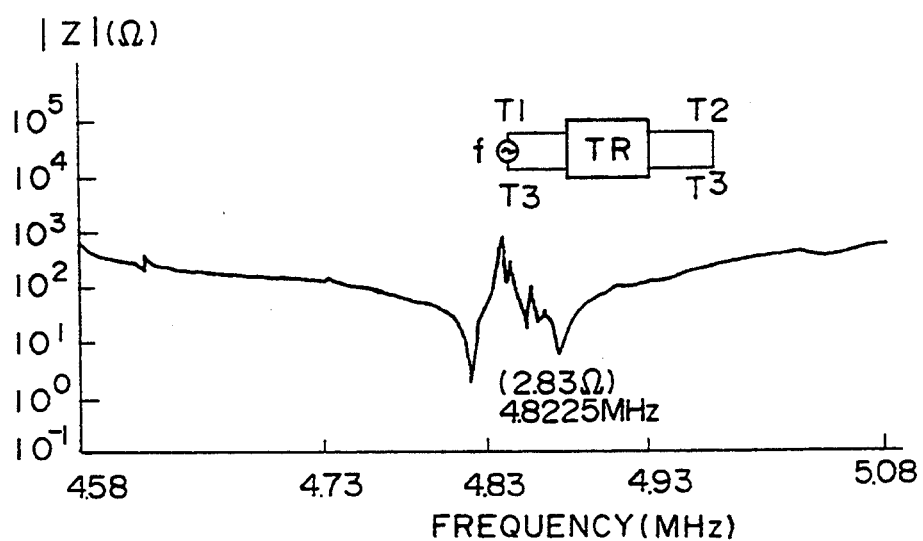
F I G. 38(B)
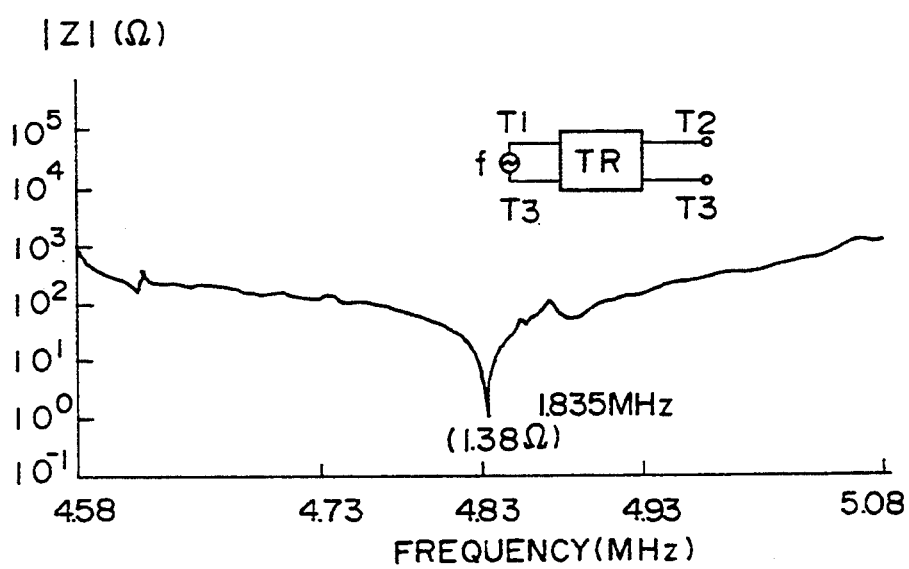

PIEZOELECTRIC TRANSFORMER PRODUCING AN OUTPUT A.C. VOLTAGE WITH REDUCED DISTORTION

CROSS-REFERENCE TO RELATED APPLICATIONS

The present invention is a continuation-in-part application of the United States patent application Ser. No. 834,360 filed on Feb. 2, 1992 now abandoned.

BACKGROUND OF THE INVENTION

The present invention generally relates to piezoelectric devices and more particularly to a piezoelectric transformer supplied with an input a.c. current for stepping up or stepping down a voltage thereof.

Conventionally, stepping up or stepping down of a.c. voltage has been achieved by electromagnetic transformers. The electromagnetic transformer generally has a primary side winding and a secondary side winding coupled electromagnetically by a magnetic core. In such a construction, it is generally inevitable that the transformer has a substantial size. On the other hand, there are applications, particularly for the information processing apparatuses including the CRT displays, electrostatic printers, DC converters, and the like, wherein a reduced size is demanded for the transformer. Further, some of the applications require a high output voltage such as several thousand volts in addition to the reduced size, while there are applications where a large output current is needed as in the case of the power transformers.

Meanwhile, there is a proposal to use piezoelectric crystals or ceramics for the transformer (C. A. Rosen, Proc. Electronic Components Symp. p. 205, 1957). There, primary side and secondary side electrodes are provided on a piezoelectric substrate, and a piezoelectric vibration is induced in the piezoelectric substrate in response to an application of a primary size voltage across the primary side electrodes. The piezoelectric vibration thus induced is converted to a voltage at the secondary side electrodes.

FIGS. 1(A) and 1(B) show the conventional piezoelectric transformer proposed in the above reference.

Referring to the drawings, the piezoelectric transformer includes a piezoelectric substrate 2 that in turn is formed substantially from two portions, one having a polarization $P_i$ that acts in the direction of the thickness of the substrate and the other having a polarization $P_o$ that acts in the longitudinal direction of the substrate 2. In correspondence to the first portion of the substrate 2, a pair of primary side electrodes 4a and 4b are provided to oppose with each other, and a primary side voltage $V_i$ is applied across the electrodes 4a and 4b. Thereby, a vibration is induced in the substrate 2 in the vertical direction as shown by the lines d and d', wherein the lines d and d' represent the distribution profile of the displacement that is caused in the substrate as a result of the vibration at two different instances. Further, at the longitudinal end of the substrate 2, there is provided a secondary side electrode 6 for converting the piezoelectric vibration to an electric voltage $V_o$. There, the electrode 4b at the bottom of the substrate 2 is used also for one of the secondary side electrode, and the output voltage $V_o$ is obtained across the electrode 6 and the electrode 4b. In correspondence to the node of vibration, there is provided a mechanical support 8 for supporting the substrate 2 such that the substrate 2 vibrates freely.

The step-up or step-down operation of the piezoelectric transformer is represented as $$V_o/V_i \infty K_{31} \cdot K_{33} \cdot Q_1 \cdot L_2/L_1 \tag{1}$$

wherein $K_{31}$ represents the electromechanical coupling coefficient for the transverse effect while $K_{33}$ represents the electromechanical coupling coefficient for the longitudinal effect. Further, $L_1$ stands for the thickness of the substrate 2, and $L_2$ represents the longitudinal length of the second portion of the substrate 2. See FIG. 1(B). Further, $Q_1$ represents the quality factor or Q of the substrate 2. From this equation, it will be understood that one can control the step-up or step-down ratio as desired by setting the geometrical parameters $L_1$ and $L_2$ as well as by suitably choosing the material parameters $K_{31}$, $K_{33}$ and $Q_1$.

In this conventional device, however, there arises a problem in that the preparation of the substrate 2 that has two portions with respective, mutually different polarizations, is difficult. For example, the substrate 2 may be formed by joining a first piezoelectric plate having the polarization $P_i$ and a second piezoelectric plate having the polarization $P_o$ with each other by an adhesive. However, the application of the voltage to the primary side electrodes 4a and 4b induces a large amplitude vibration particularly at the part where the first plate and the second plate are joined with each other, and there arises a problem that the piezoelectric substrate may be damaged or destroyed during the use of the device. Further, the piezoelectric transformer of this prior art has a large internal resistance due to the large distance between the electrode 4b and the electrode 6. Because of this, the piezoelectric transformer of this proposal is not suitable for power transformers or DC-DC converters where a large output current is required.

In order to eliminate these problems and to provide a piezoelectric transformer that endures for the practical use, the inventors of the present invention have proposed in the Japanese Patent Application 2-249574 filed Sep. 18, 1990 and in the corresponding United States patent application Ser. No. 761,049, a piezoelectric transformer that uses a longitudinal mode vibration or longitudinal wave excited in a piezoelectric substrate by the piezoelectric transverse effect.

Referring to FIGS. 2(A) and 2(B) showing this conventional device, the piezoelectric transformer uses a piezoelectric substrate 12 of 140° rotated Y-cut LiNbO$_3$ having a polarization P in the Z-direction. The substrate 12 is cut from a single crystal ingot of LiNbO$_3$ having the X-axis, Y-axis and Z-axis in correspondence to the crystal anisotropy, with an orientation such that a longitudinal direction of the substrate 12 defined as the Z'-direction is rotated about the X-axis an angle of 140°. See the crystal orientation shown in FIG. 3. Thereby, the Y'-direction that extends in the vertical direction to the substrate 12 also forms the angle of 140° with respect to the original Y-axis. On the other hand, the transverse direction defined as the X'-direction of the substrate 12 coincides with the X-axis. It should be noted that the foregoing orientation is chosen to obtain a maximum electromechanical coupling $k_{33}$.

On the upper and lower major surfaces of the substrate 12, primary side electrodes or input electrodes 14a and 14b are provided to oppose with each other across the substrate 12 at a first half of the substrate 12. Further, secondary side electrodes or output electrodes 16a and 16b are provided to oppose with each other across the substrate 12 at a second half of the substrate 12. See the perspective diagram of FIG. 2(A). There, the electrodes 14a and 16a are aligned in the longitudinal direction on the upper major surface of the substrate 12, while the electrodes 14b and 16b are aligned also in the longitudinal direction at the lower major surface of the substrate 12. In the this conventional device, the longitudinal size and hence the area of the electrode 14a are set substantially equal to those of the electrode 16a. Similarly, the longitudinal size and hence the area of the electrode 14b are set substantially equal to those of the electrode 16b.

In operation, a longitudinal wave is excited in the substrate 12 upon the application of the input a.c. voltage $V_i$ across the electrodes 14a and 14b. Thereby, the longitudinal wave propagates in the longitudinal direction of the substrate in correspondence to the piezoelectric lateral effect and establishes a resonance with the frequency that is determined by the longitudinal size of the substrate. For example, the longitudinal size of the substrate 2 may be set equal to about one-half of the wavelength of the longitudinal wave excited in the substrate 12. The resonant vibration thus formed in the substrate 12 is then converted to an electric output $V_o$ at the electrodes 16a and 16b. As the direction of polarization is uniform in the substrate 12, the localized concentration of stress that may damage or destroy the substrate as in the case of the device of FIGS. 1(A) and 1(B) does not occur.

The step-up ratio $V_o/V_i$ is given as $$V_o/V_i \infty k_i \cdot k_o \cdot Q_a \cdot l_{01}/l_{02} \qquad (2)$$

where $k_i$ and $k_o$ represent respectively the electromechanical coupling coefficient at the part where the input electrodes 14a and 14b are provided and the electromechanical coupling coefficient at the part where the output electrodes 16a and 16b are provided. Further, $Q_a$ represents the quality factor of the substrate 12, $l_{01}$ represents the distance between the electrodes 14a and 14b, and $l_{02}$ represents the distance between the electrodes 16a and 16b. In the prior art device in consideration, the ratio $l_{01}/l_{02}$ becomes to about 1.

FIG. 4 and FIGS. 5(A)-5(C) show the operational characteristics of the piezoelectric transformer of the foregoing prior art based upon the well known Mason's equivalent circuit model, wherein FIG. 4 shows the change of input impedance with the frequency of the input a.c. voltage $V_i$.

Referring to FIG. 4, the input impedance Z is inductive at the lower frequency range while changes drastically to capacitive at a resonant frequency $f_r$ as demonstrated by the phase angle term of Z that changes from $-90°$ to $+90°$. Hereinafter, the resonant frequency $f_r$ will be defined as the frequency at which the phase angle assumes the value of $-90°$.

In this conventional piezoelectric transformer, the resonant frequency $f_r$ changes in response to the load that is connected across the electrodes 16a and 16b as shown in FIG. 5(A).

Referring to FIG. 5(A), the resonant frequency $f_r$ changes stepwise with load resistance $R_1$ at the value of about $10^4 \Omega$, and in correspondence to this stepwise change of the resonant frequency $f_r$, there appears a peak in the input resistance $R_r$ that is the input resistance in the state where the resonance explained with reference to FIG. 4 is established. See FIG. 5(B). More specifically, the input resistance $R_r$ increases with the load resistance $R_1$ in the range where the value of the load $R_1$ is smaller than about $10^4 \Omega$, and can reach as high as $10^4 \Omega$ or more.

Most importantly, the step-up ratio $V_o/V_i$ becomes unity when the load resistance $R_1$ connected across the output electrodes 16a and 16b is smaller than about $10^4 \Omega$. See FIG. 5(C). This means that no stepping-up or stepping-down is obtained in the piezoelectric transformer when the load $R_1$ connected to the transformer has a resistance of smaller than $10^4 \Omega$. In other words, the piezoelectric transformer of this prior art does not function as the step-up or step-down transformer when used as a power transformer that produces a large output current.

Further, when using the piezoelectric transformer for various applications, there has been a problem in that the output waveform of the piezoelectric transformer is distorted significantly due to the unwanted resonance occurring at various frequencies. It is thought that such unwanted resonance occurs by the mechanical resonance of the piezoelectric substrate at a number of vibration modes, and there is a demand for a piezoelectric transformer in which the distortion is minimized from the output voltage.

SUMMARY OF THE INVENTION

Accordingly, it is a general object of the present invention to provide a novel and useful piezoelectric transformer, wherein the foregoing problems are eliminated.

Another and more specific object of the present invention is to provide a piezoelectric transformer that can exhibit a step-up/step-down operation even when a small output load is connected and can operate as a power transformer.

Another object of the present invention is to provide a piezoelectric transformer that uses a thickness vibration excited in a piezoelectric substrate for stepping up or stepping down of an input voltage, wherein the spurious noise is substantially reduced from an output voltage obtained from the piezoelectric transformer.

Another object of the present invention is to provide a piezoelectric transformer supplied with an input a.c. voltage and for producing an output a.c. voltage in response thereto, comprising:

a piezoelectric substrate having upper and lower major surfaces, said substrate extending in a longitudinal direction from a first longitudinal edge to a second, opposite longitudinal edge and in a lateral direction from a first lateral edge to a second, opposite lateral edge;

first electrode means provided on said upper major surface of said piezoelectric substrate, said first electrode means being supplied with said input a.c. voltage for causing an excitation of an elastic wave in said substrate such that said elastic wave propagates through said substrate in said longitudinal direction, said first electrode means having a periodical structure in said longitudinal direction with a pitch corresponding to a wavelength of said elastic wave; and second electrode means provided on said lower major surface of said piezoelectric substrate, for producing said output a.c. voltage by converting said elastic wave into an electric voltage, said second electrode means having a periodical structure in said longitudinal direction with a pitch corresponding to said wavelength of said elastic wave:

at least one of said first and second electrode means extending in said longitudinal direction from said first longitudinal edge to said second longitudinal edge substantially continuously.

According to the present invention, the excitation of the elastic wave is achieved substantially over the entire longitudinal length of the substrate with a pitch corresponding to the wavelength of the elastic wave. Particularly, when there is a standing wave formed in the substrate, the excitation of the elastic wave is achieved substantially over the entire longitudinal length in correspondence to the node of vibration, and a vibration mode having the wavelength corresponding to the pitch is selectively and efficiently excited. Thereby, the excitation of the spurious mode is effectively suppressed, and the piezoelectric transformer can produce the output a.c. voltage with minimized distortion. In order to obtain the output voltage, the piezoelectric transformer of the present invention uses output electrodes provided on the lower major surface of the substrate.

Other objects and further features of the present invention will become apparent from the following detailed description when read in conjunction with the attached drawings.

BRIEF DESCRIPTIONS OF DRAWINGS

FIGS. 1(A) and 1(B) are diagrams showing a first conventional example of the piezoelectric transformer:

FIGS. 2(A) and 2(B) are diagrams showing a second conventional example of the piezoelectric transformer proposed by the inventors of the present invention;

Figure 1A:
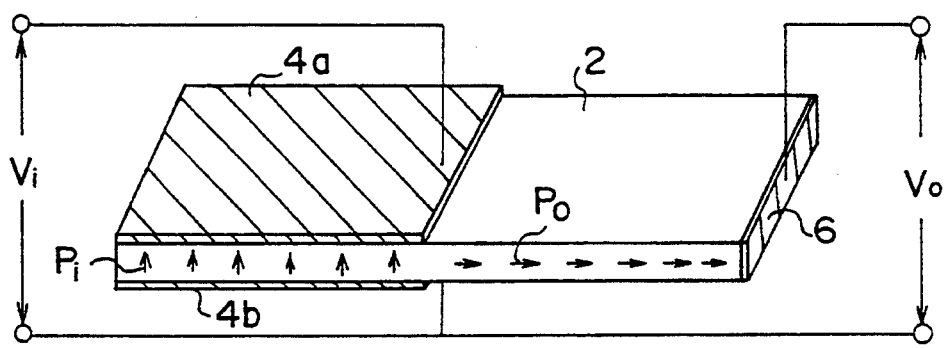
Figure 1B:
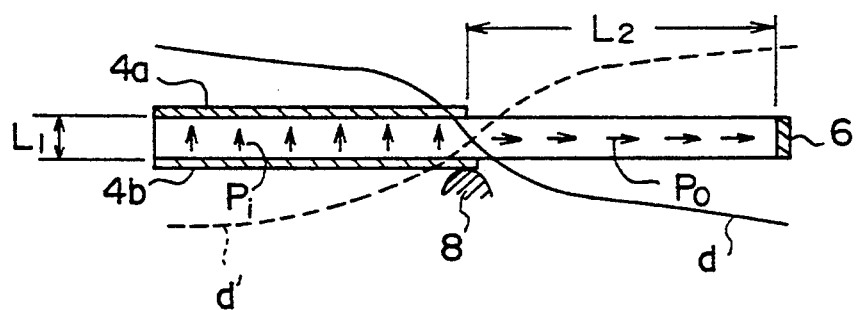
Figure 2A:
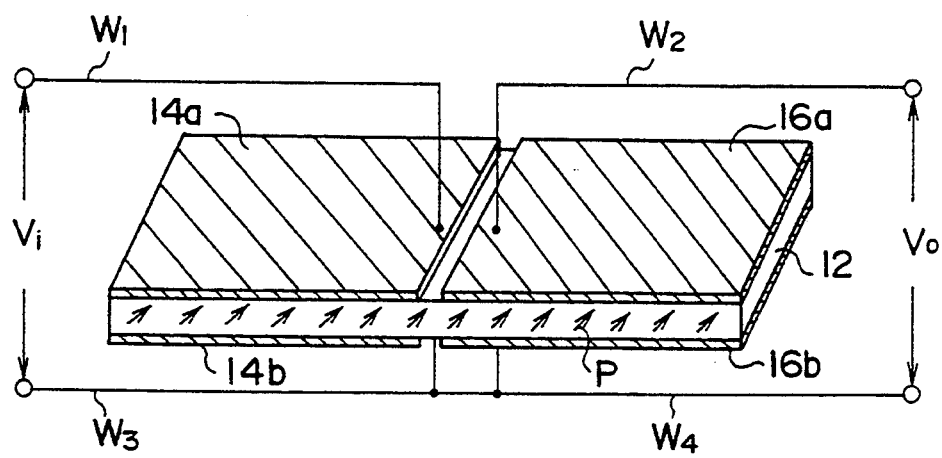
Figure 2B:
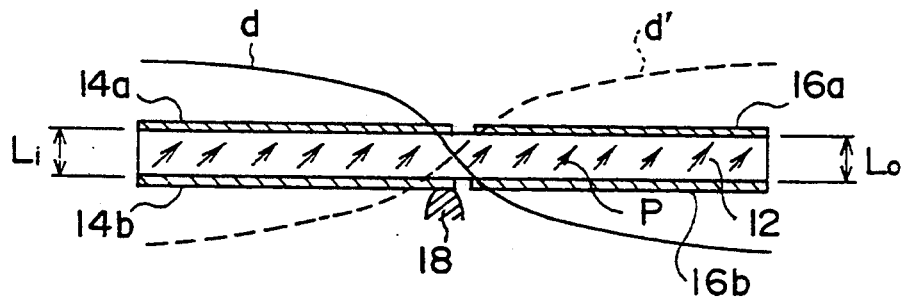
Figure 3:
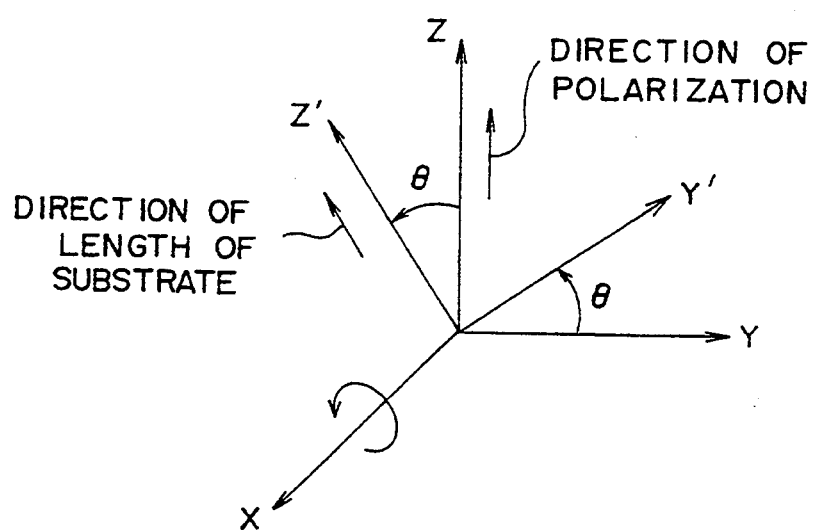
FIG. 3 is a diagram for explaining the orientation of the piezoelectric substrate used for the piezoelectric transformer of the second conventional example.
Figure 4:
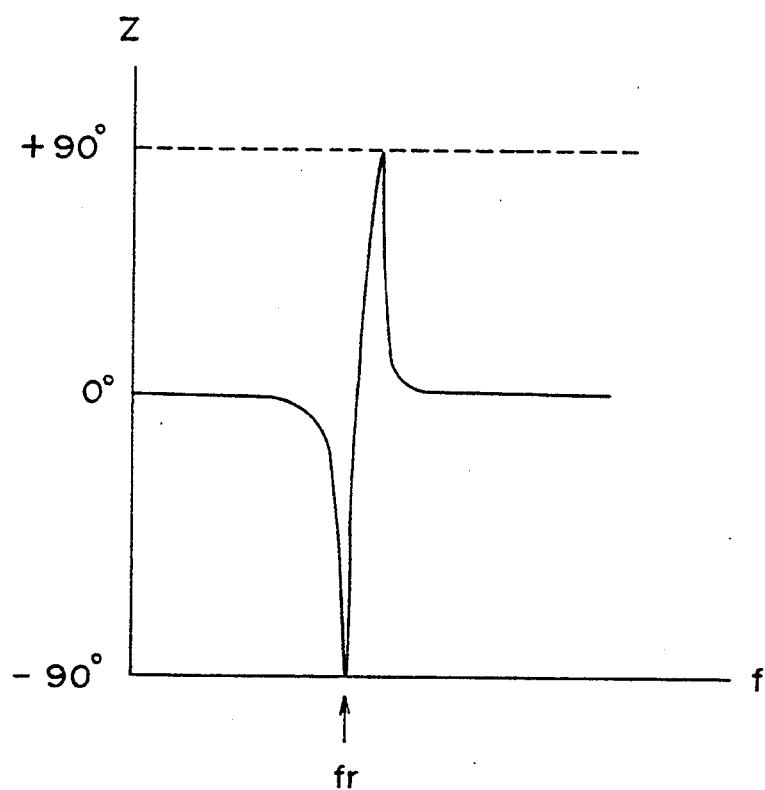
FIG. 4 is a diagram for explaining the resonant frequency of the piezoelectric transformer of the second example.
Figure 5A:
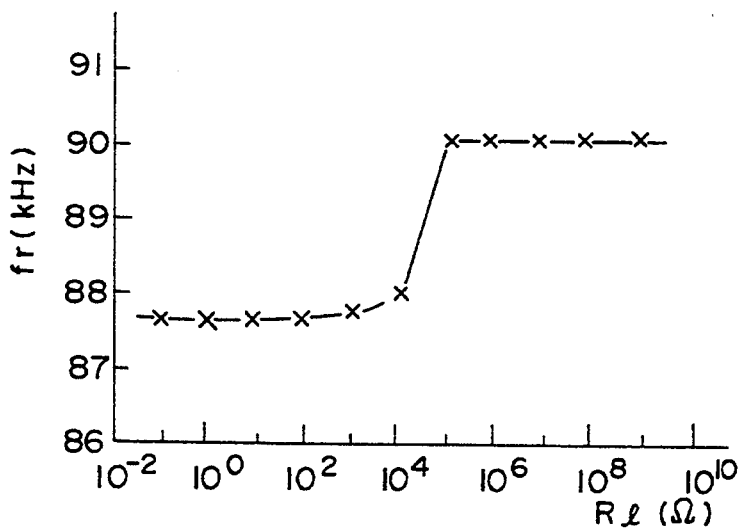
Figure 5B:
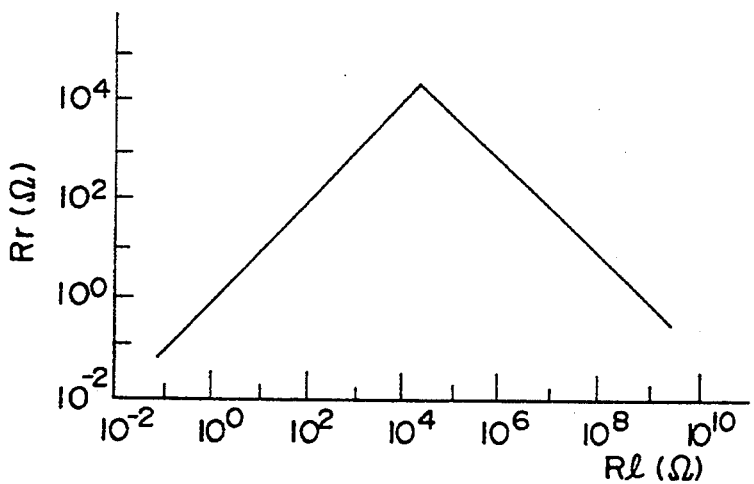
Figure 5C:
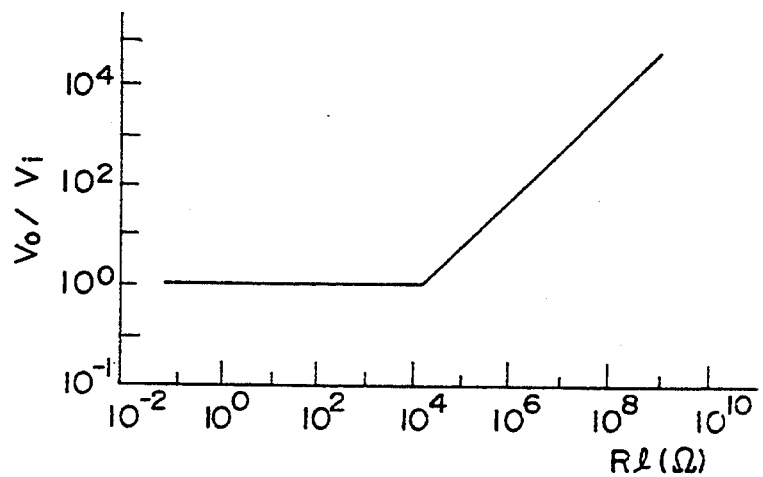
Figure 6:
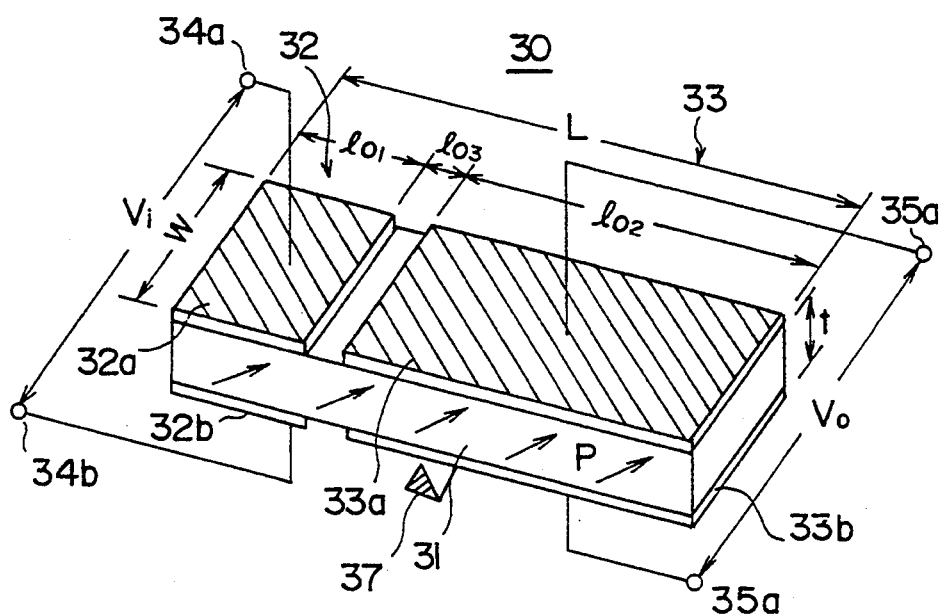
Figure 7:
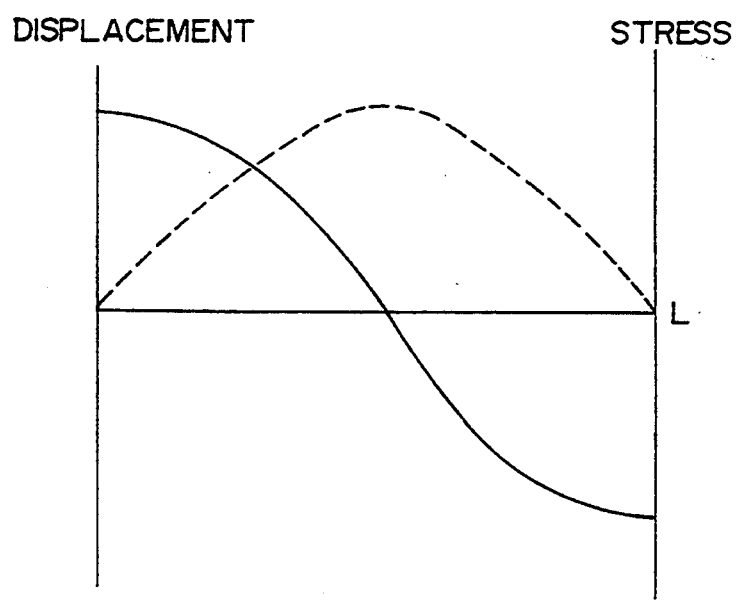
Figure 8A:
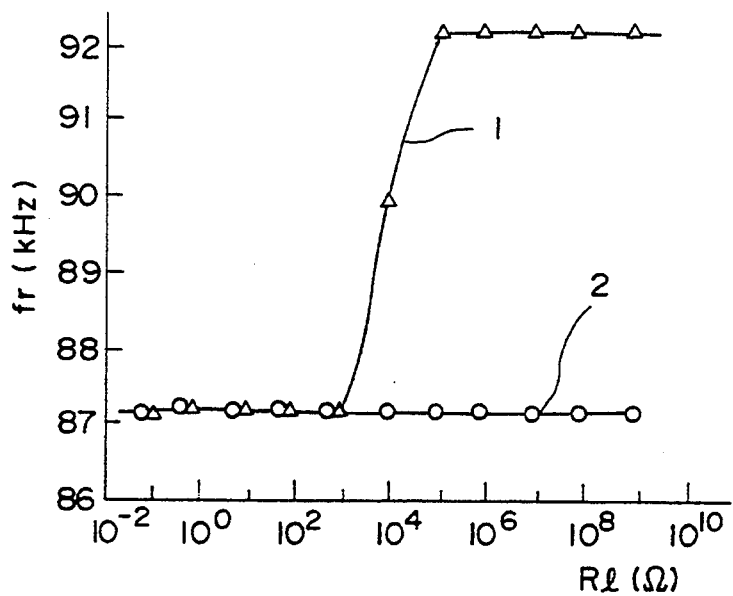
Figure 8B:
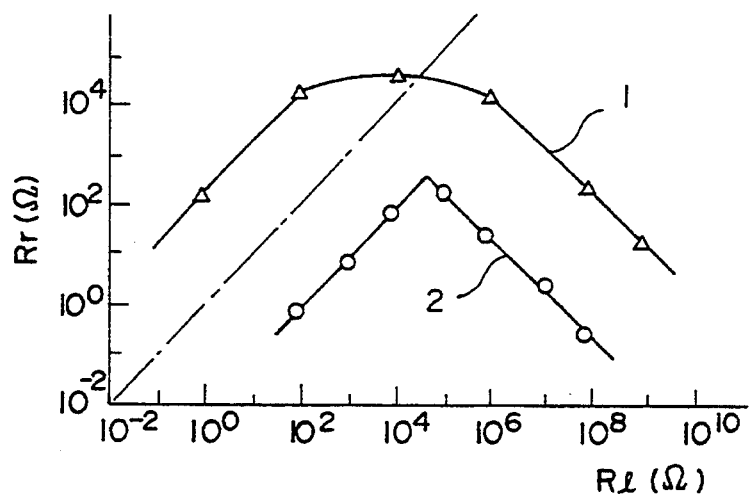
Figure 8C:
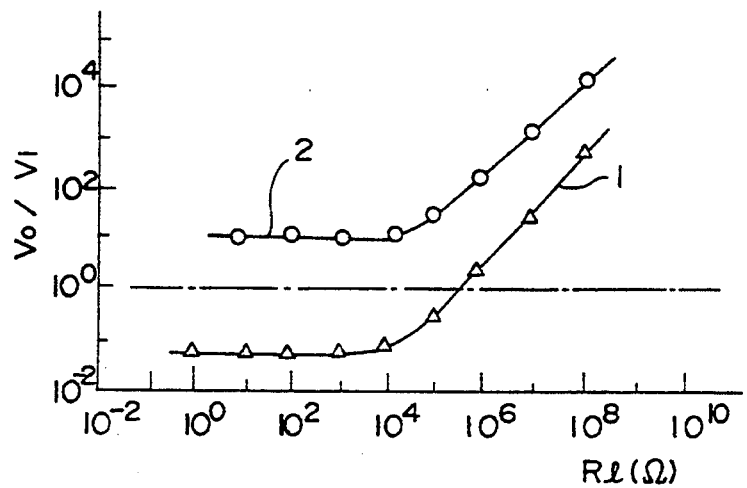
Figure 9:
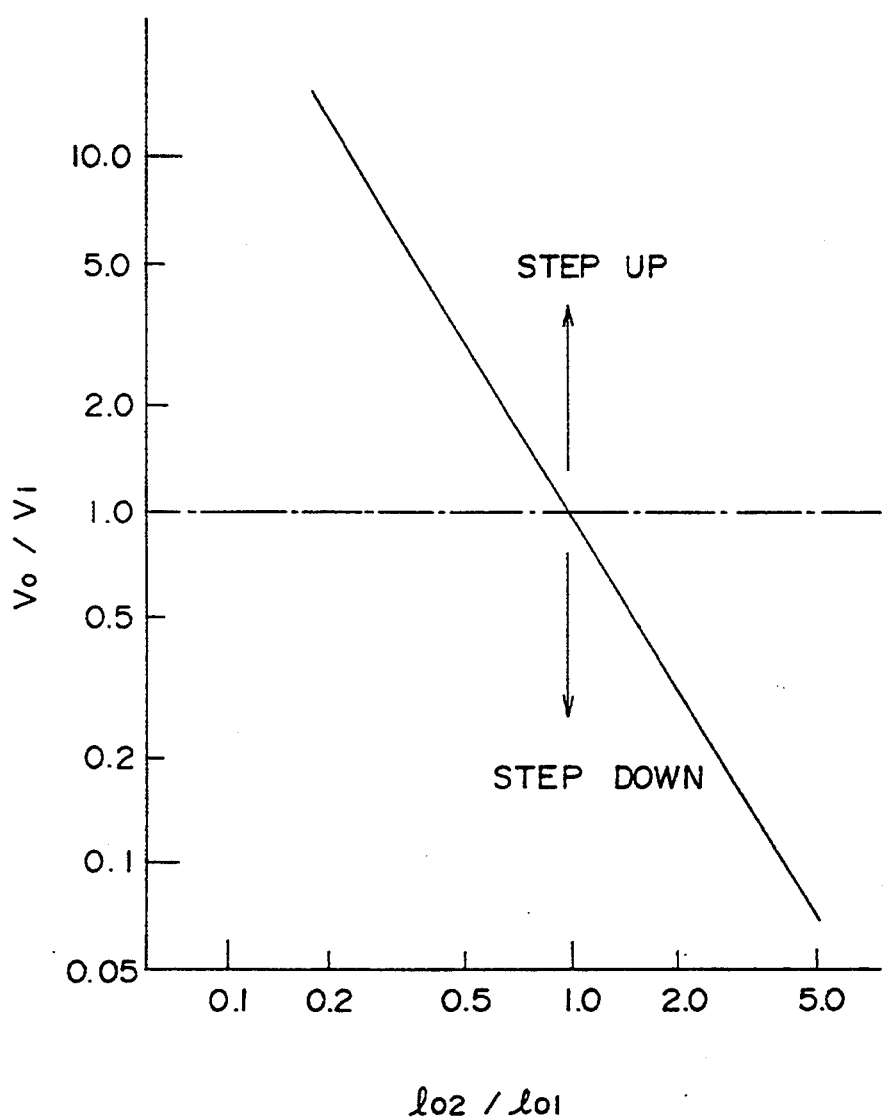
Figure 10:
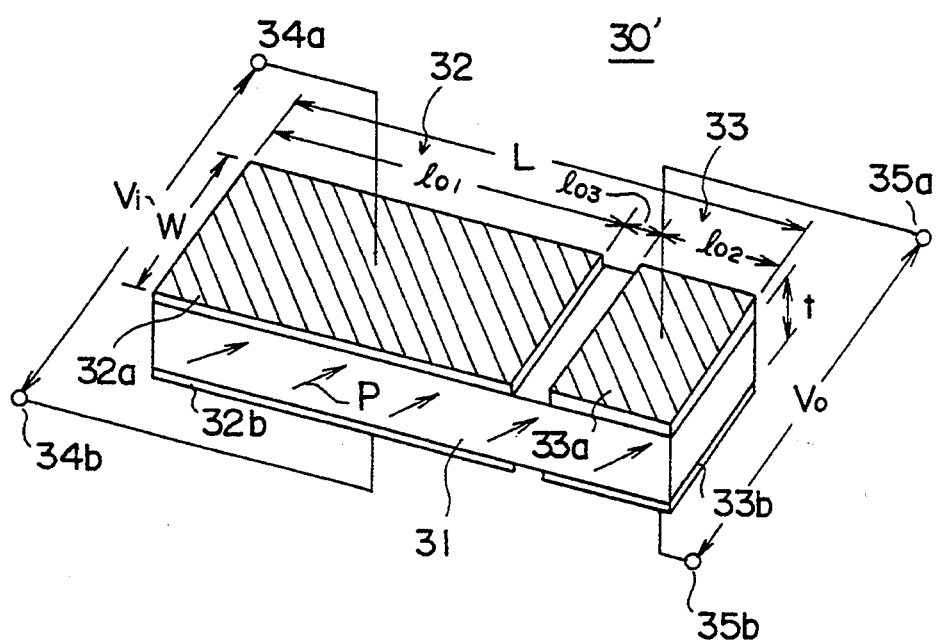
Figure 11A:
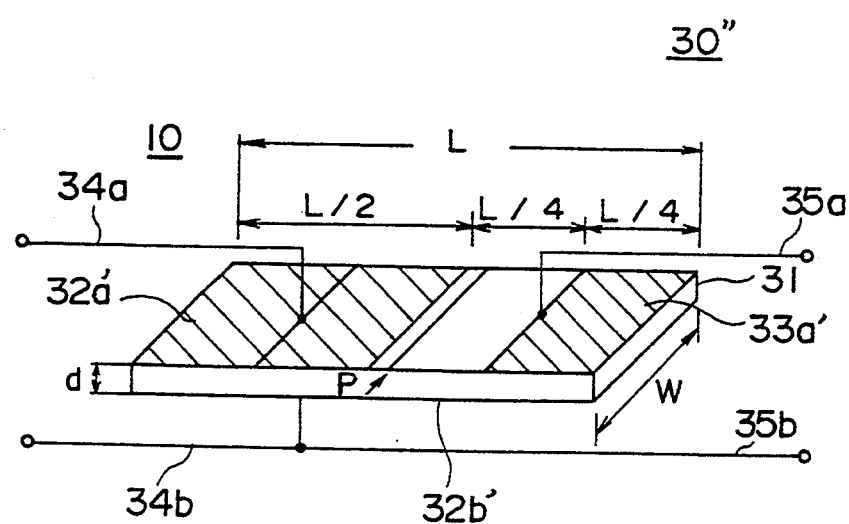
Figure 11B:
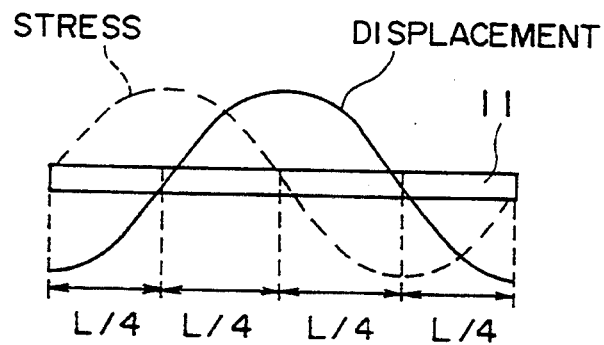
Figure 12A:
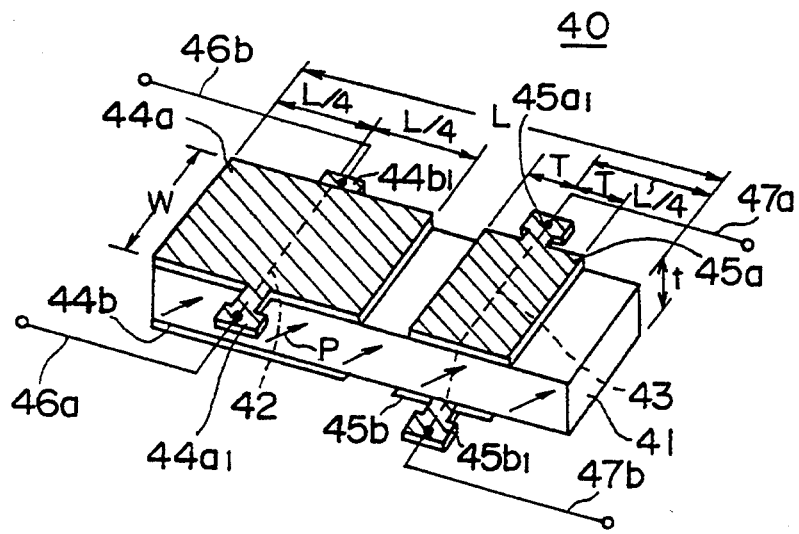
Figure 12B:
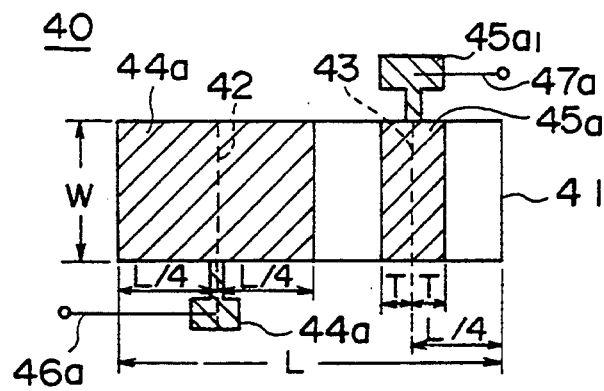
Figure 12C:
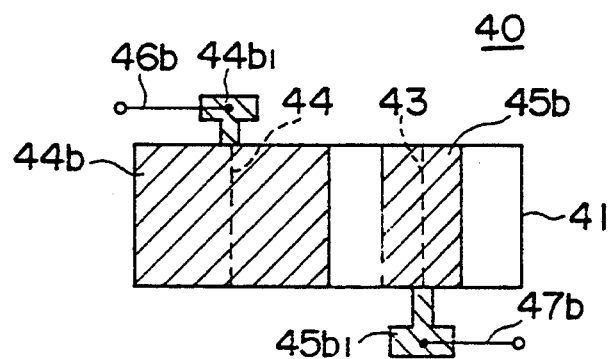
Figure 13A:
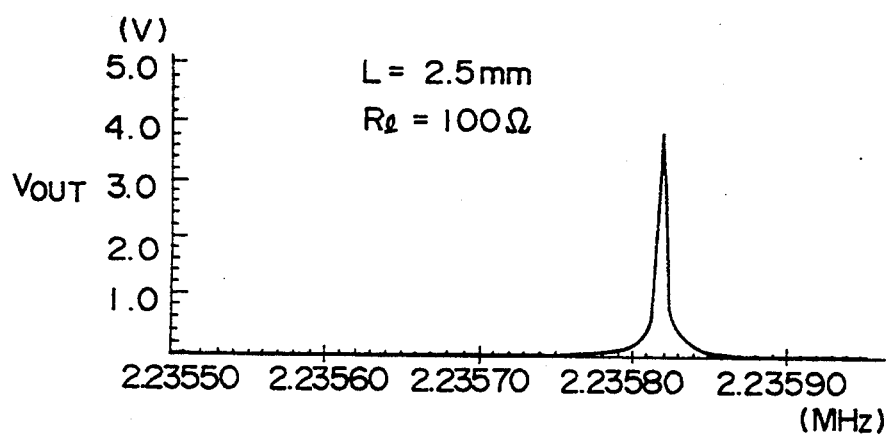
Figure 13B:
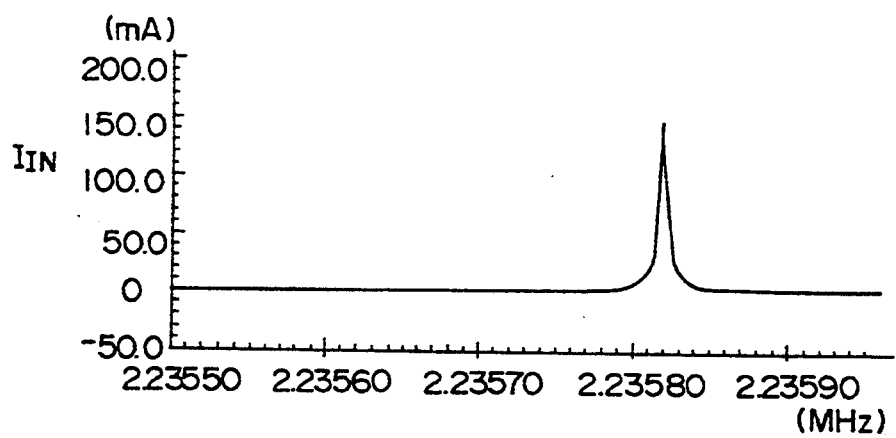
Figure 14A:
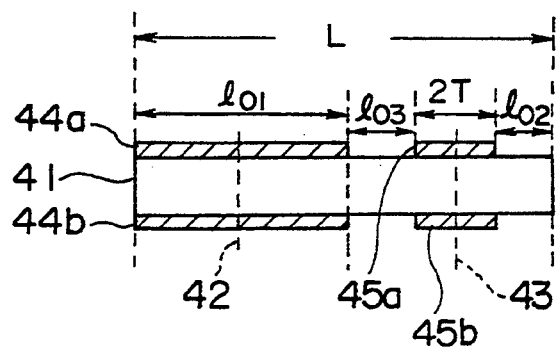
Figure 14B:
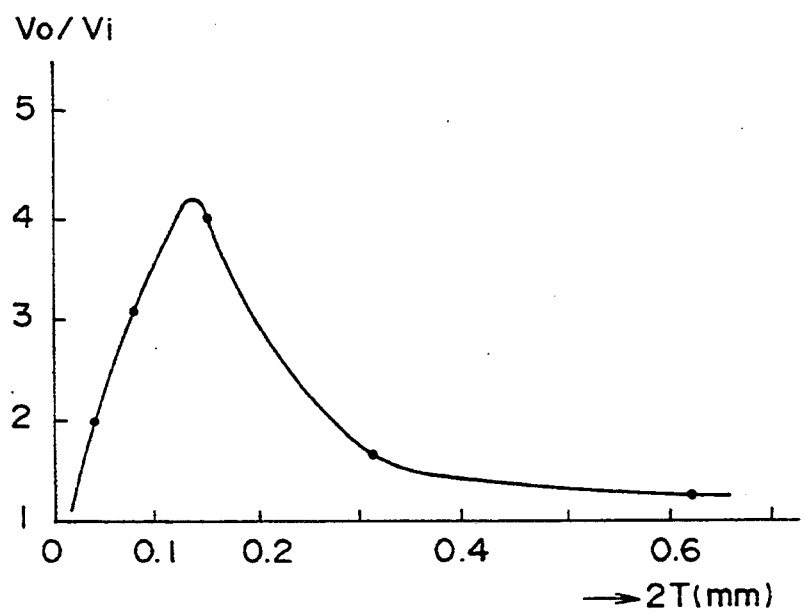
Figure 16A:
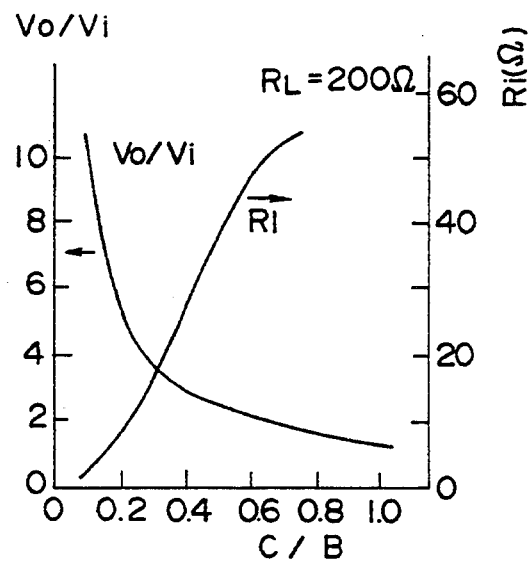
Figure 16B:
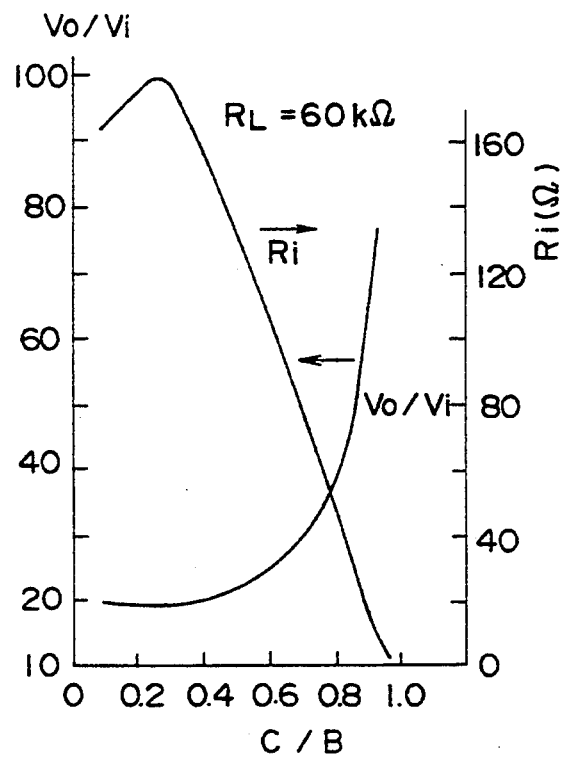
Figure 17:
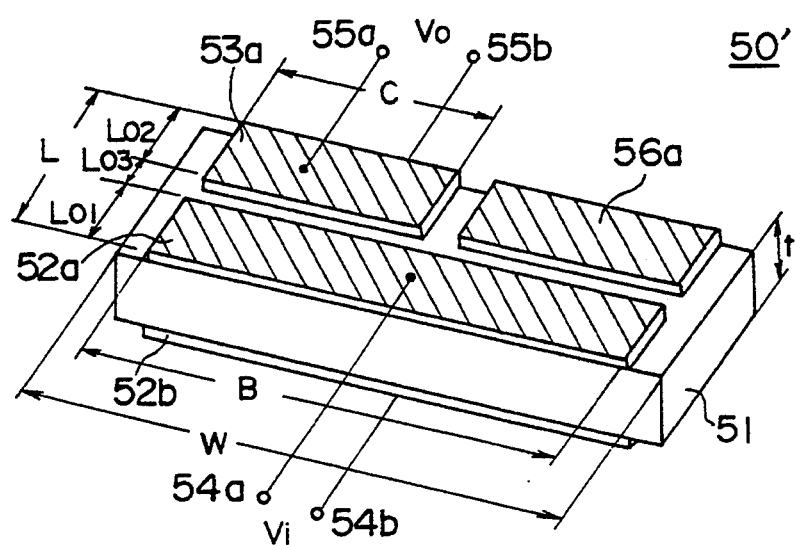
Figure 18:
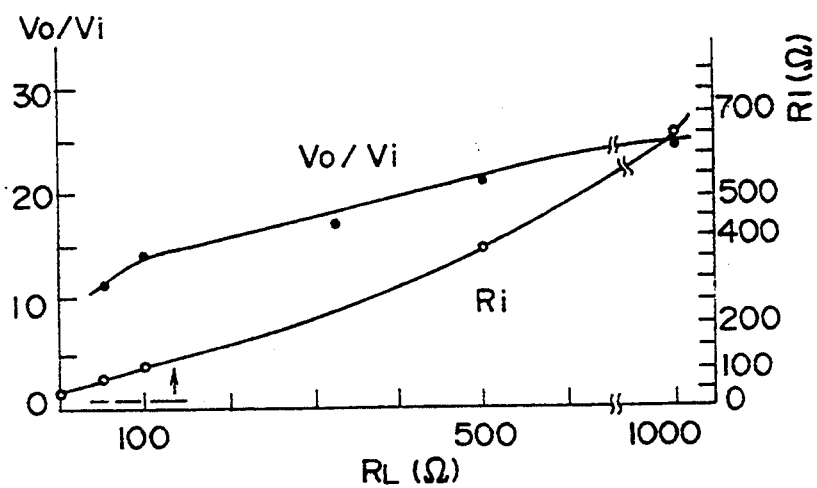
Figure 19A:
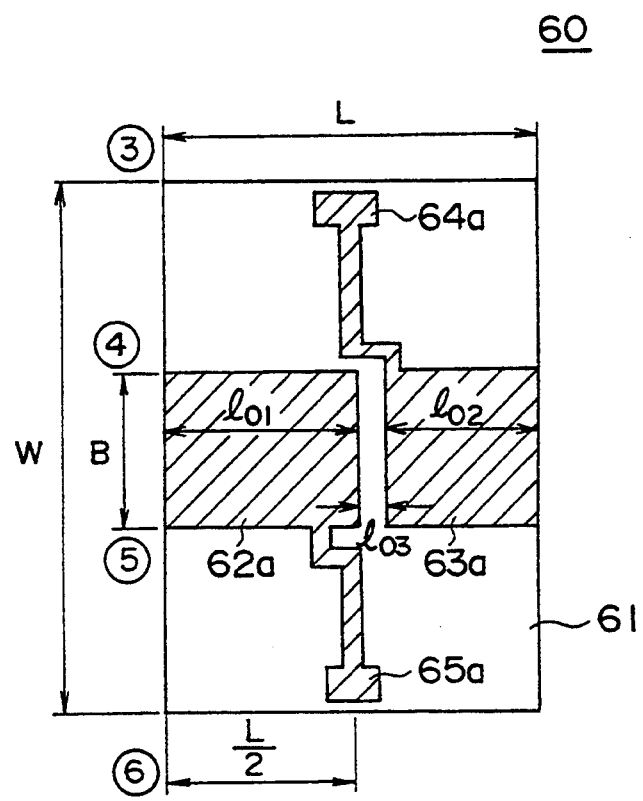
Figure 19B:
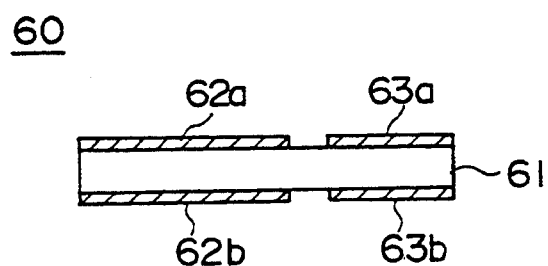
Figure 21:
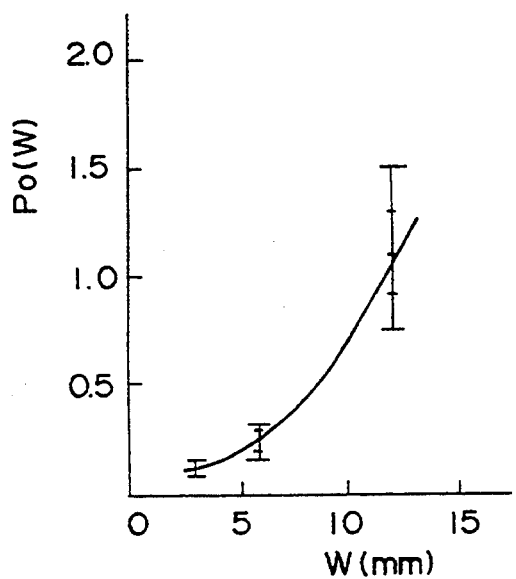
Figure 22:
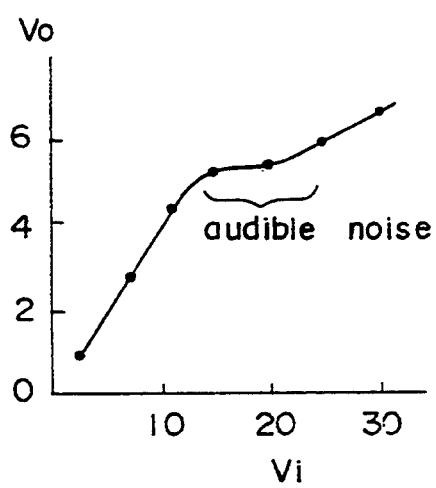
Figure 23:
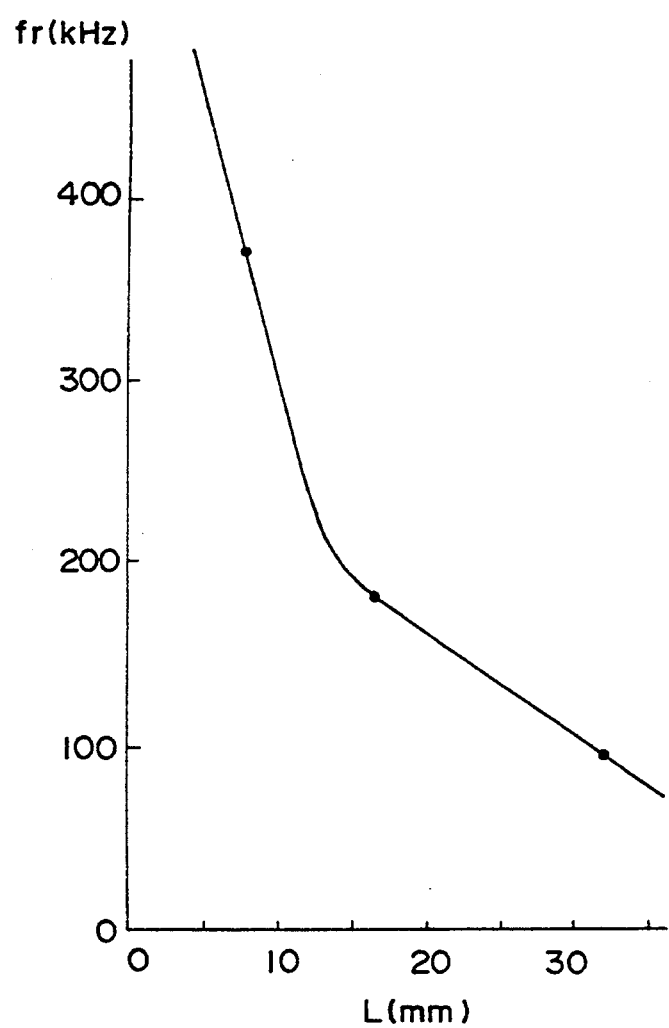
Figure 24A:
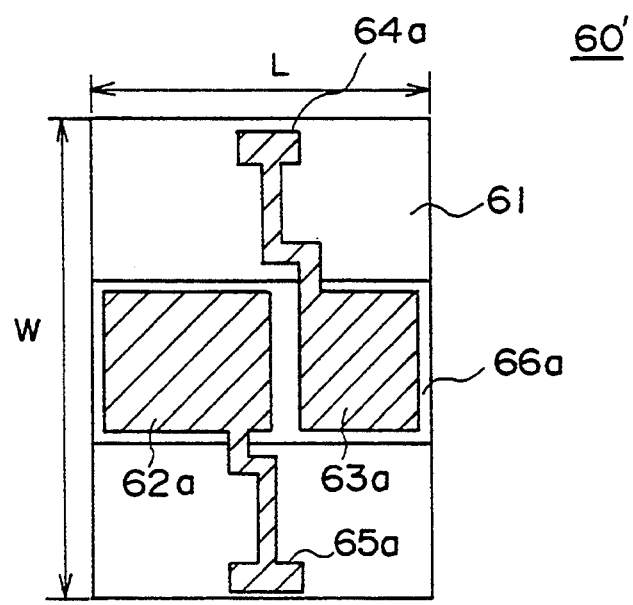
Figure 24B:
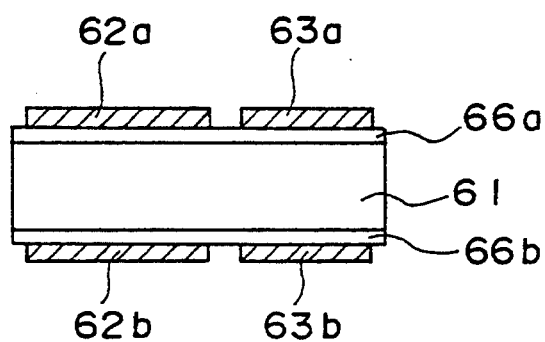
Figure 25:
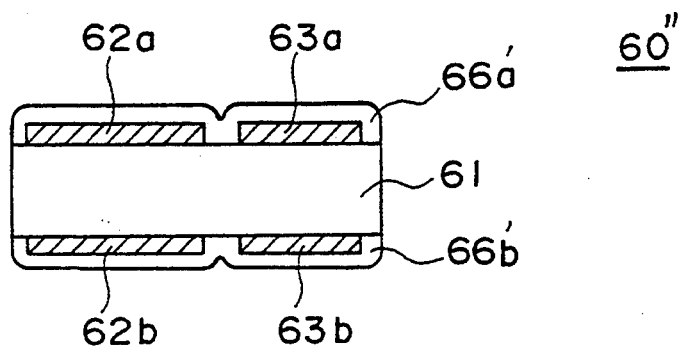
Figures 26A, 26B:
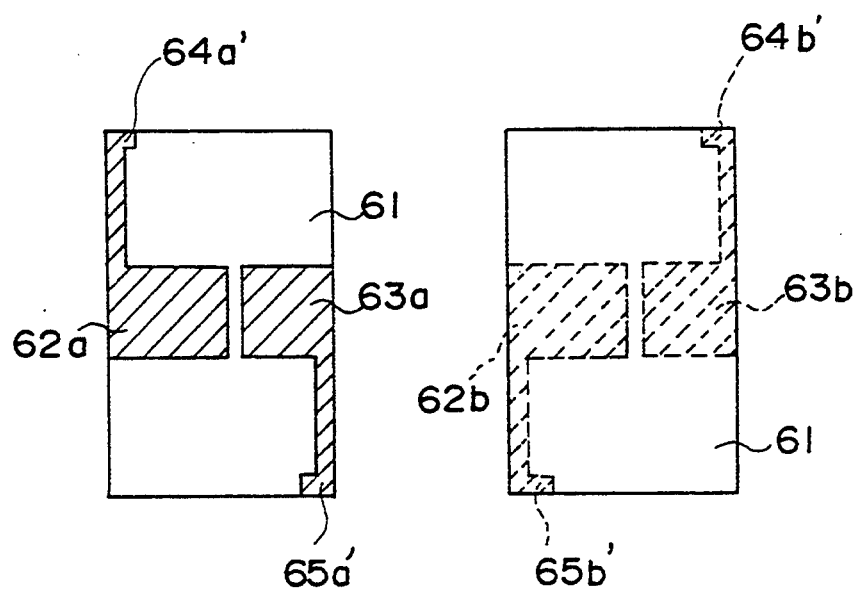
Figure 27:
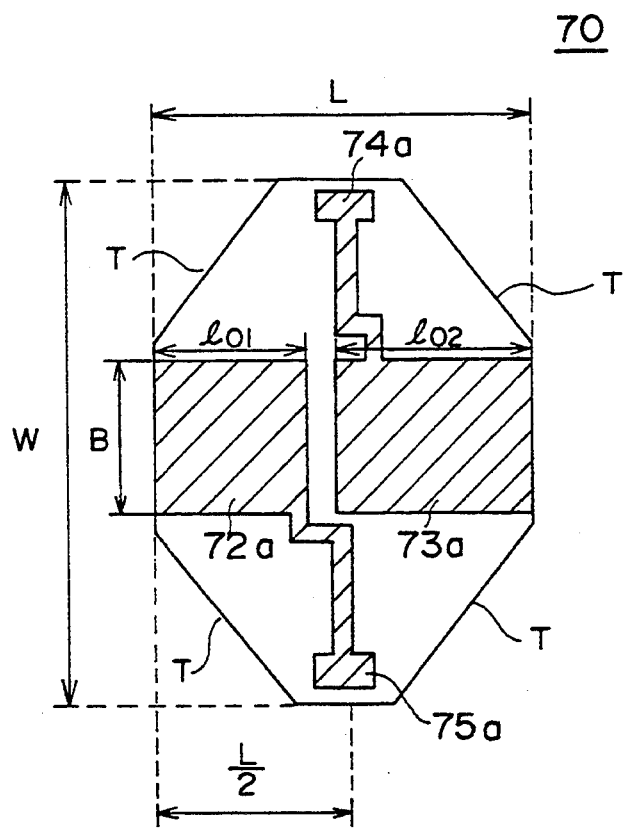
Figure 28:
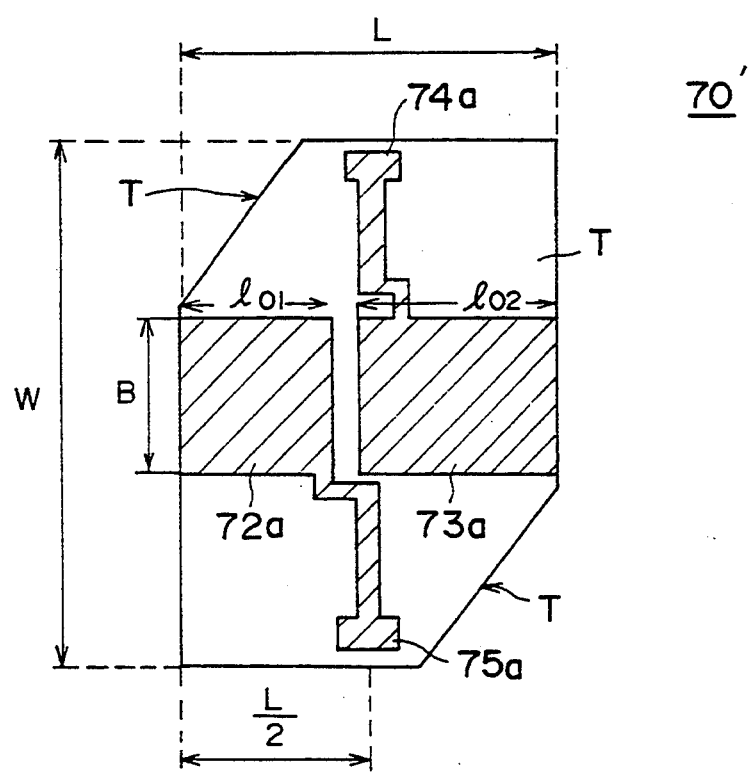
Figure 30A:
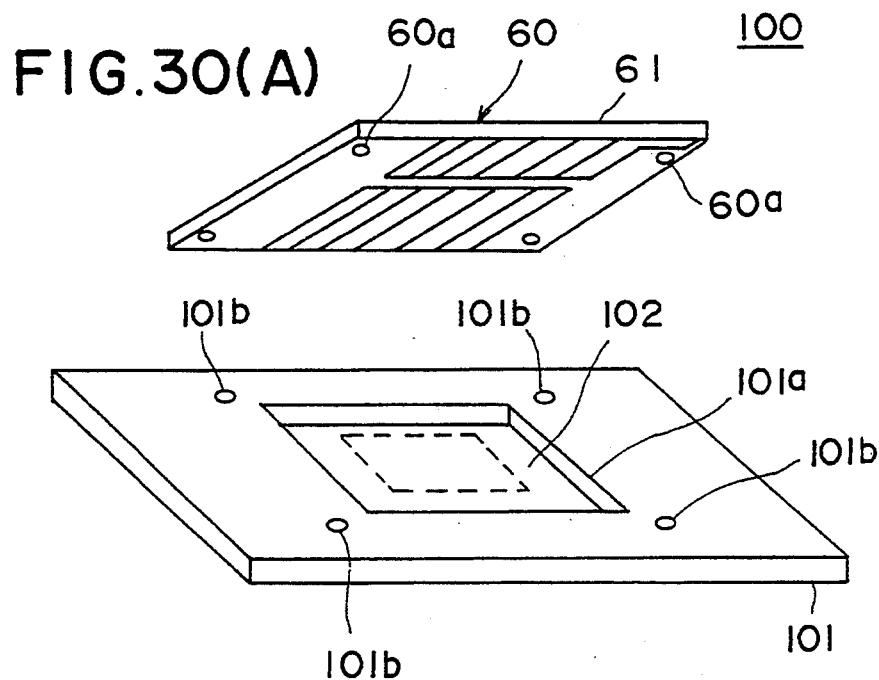
Figure 30B:
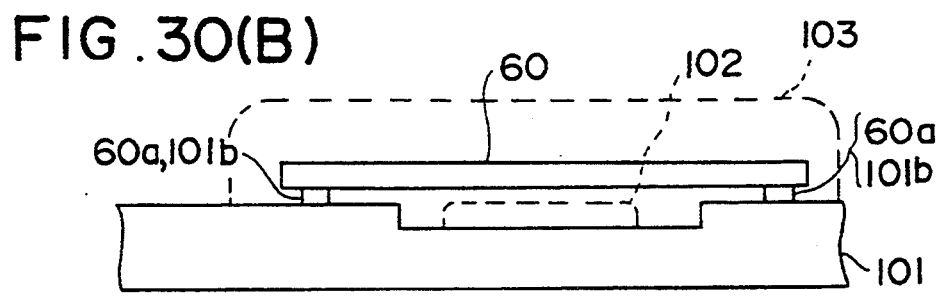
Figure 31A:
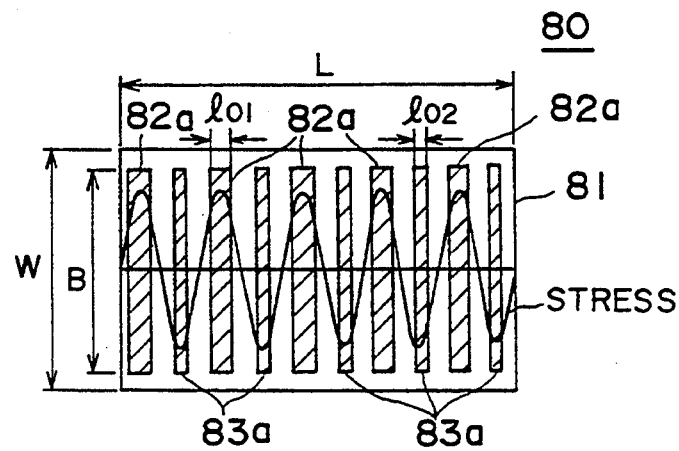
Figure 31B:
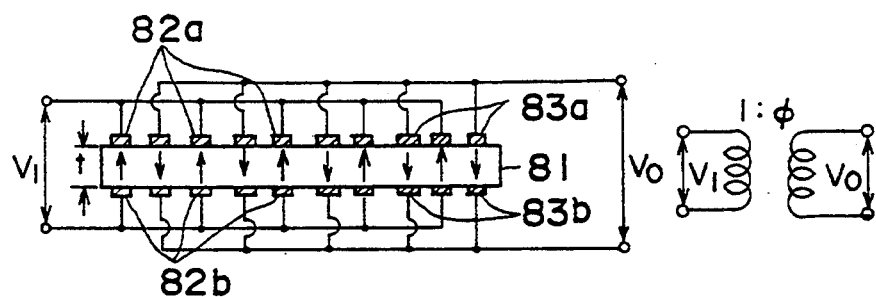
Figure 31C:
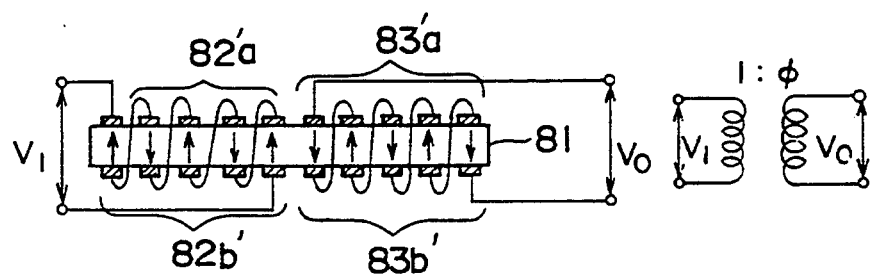
Figure 33:
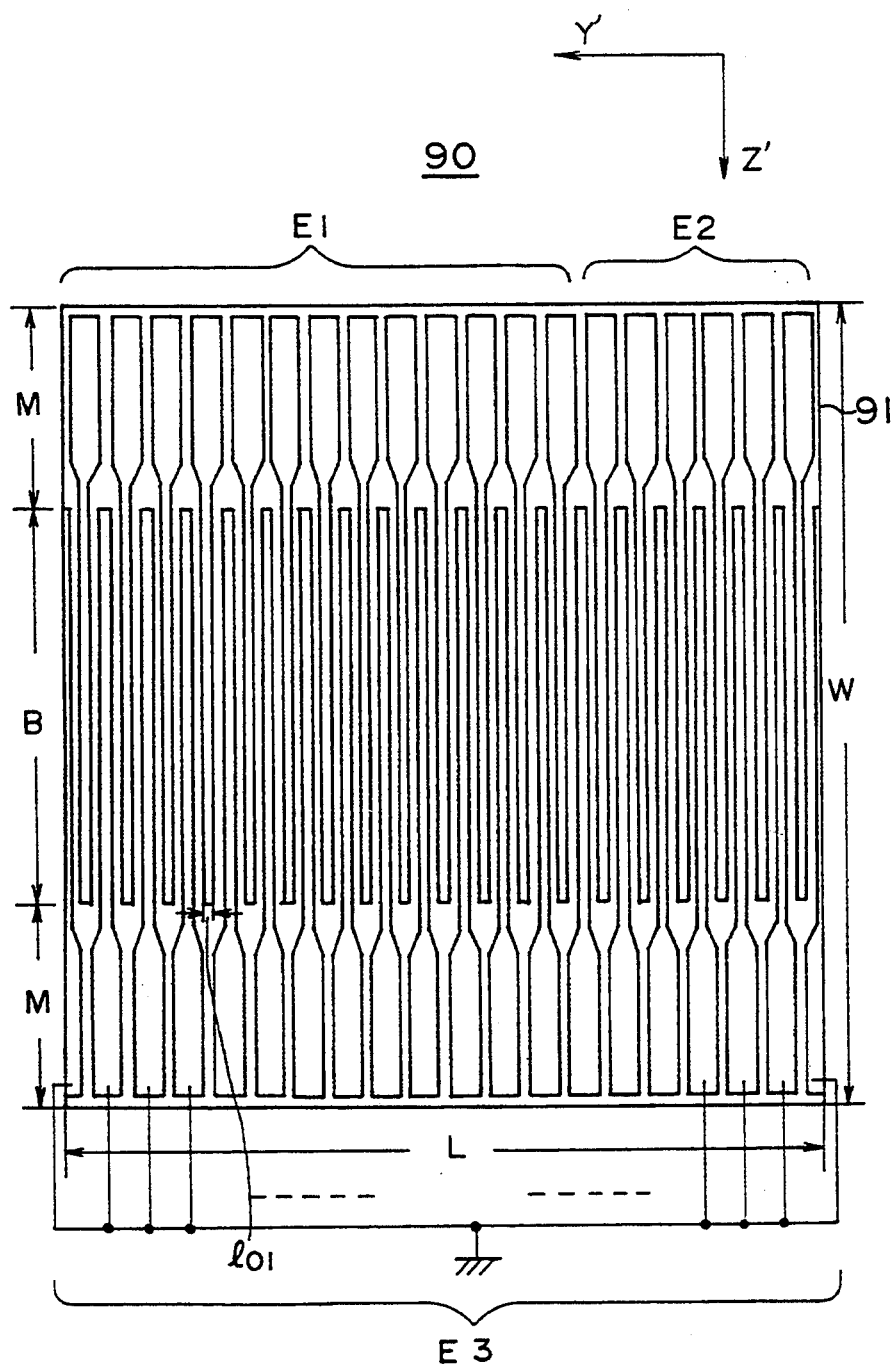
Figure 34:
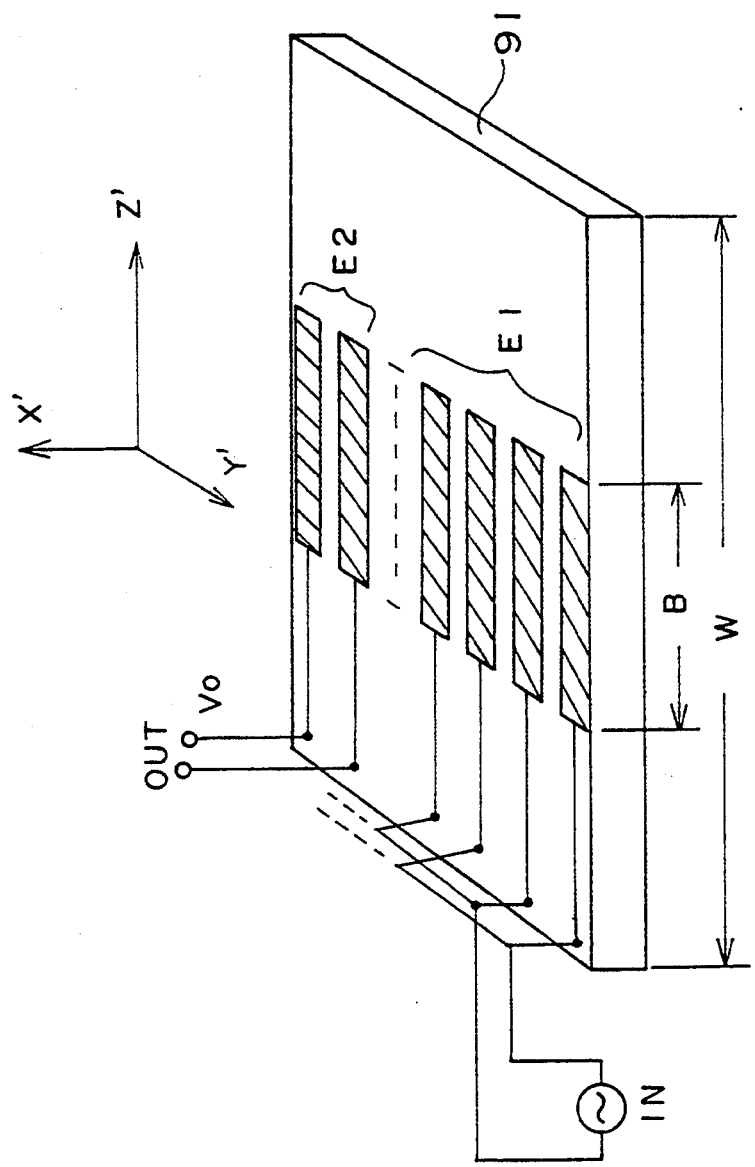
Figure 35:
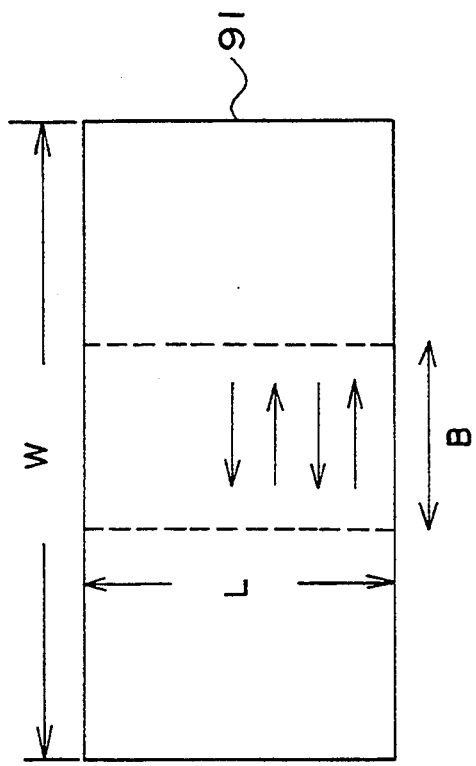
Figure 37A:
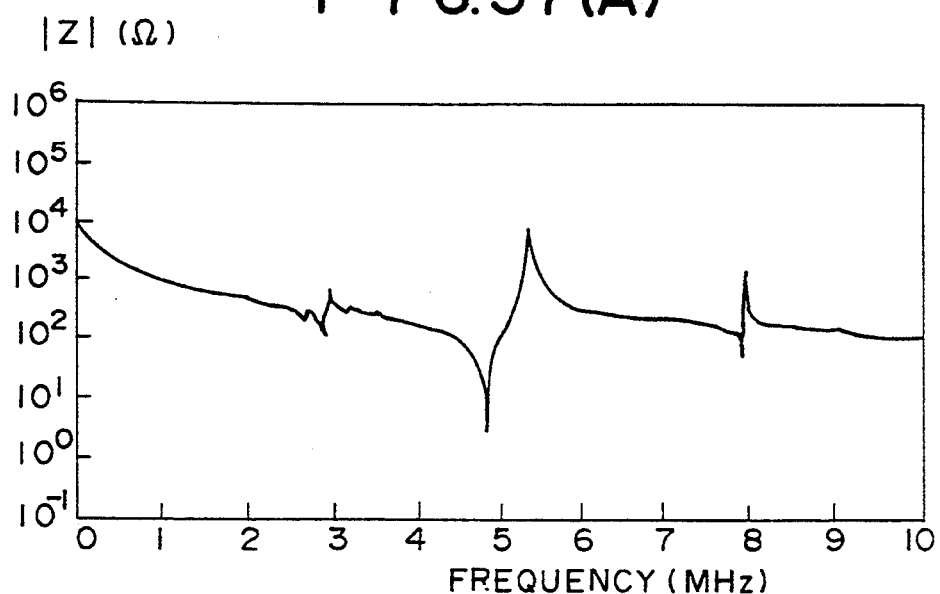
Figure 37B:
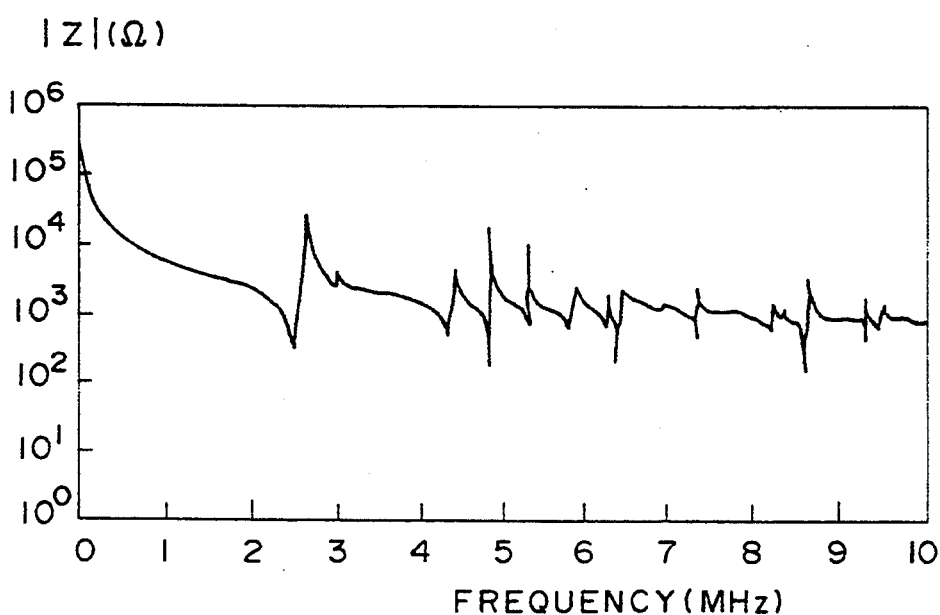
Figure 37C:
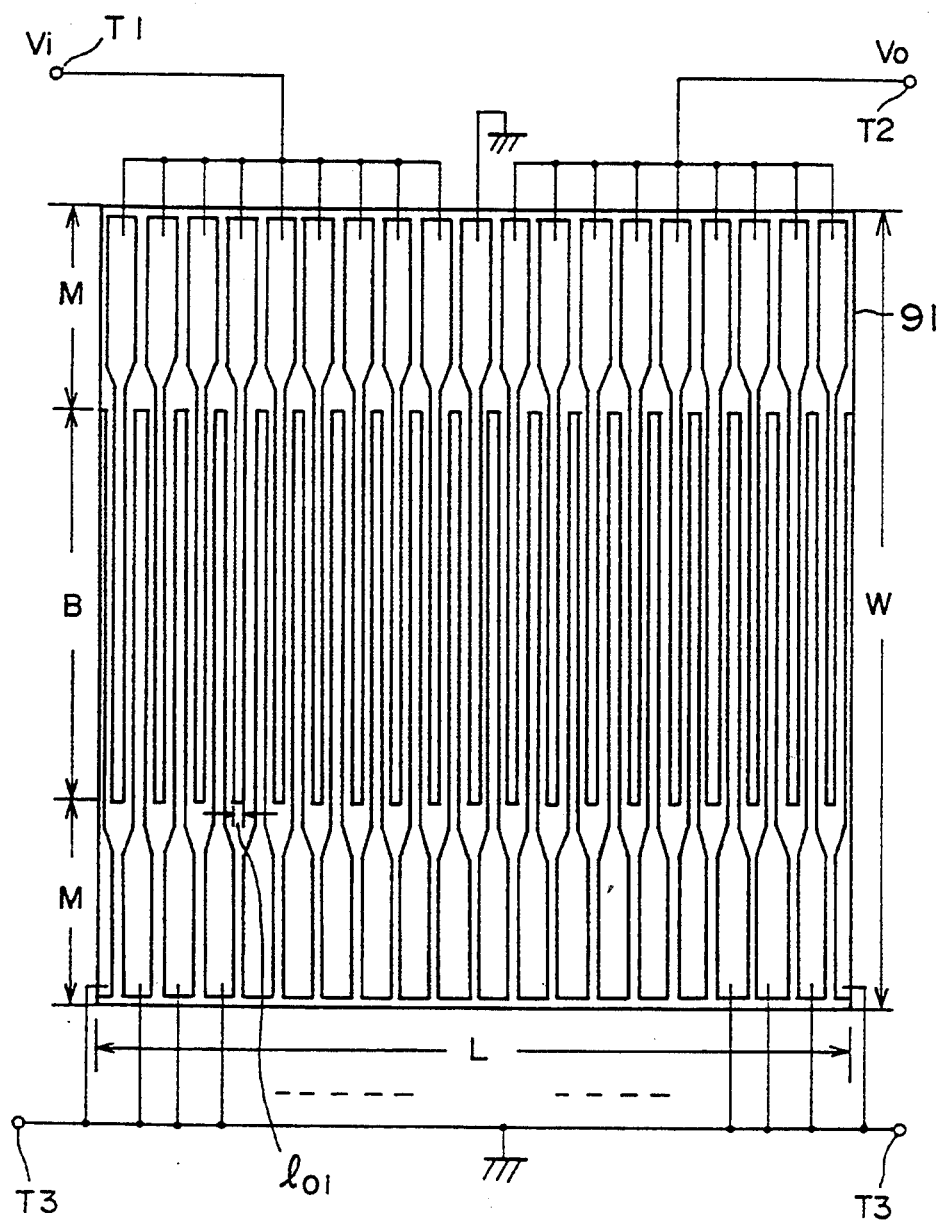
Figure 39:
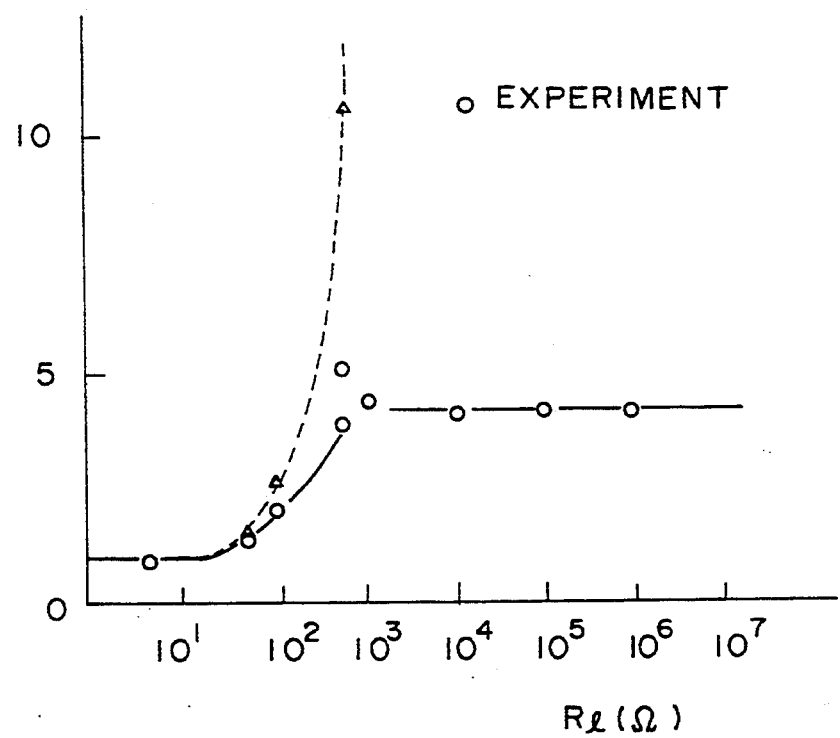
Figure 40:
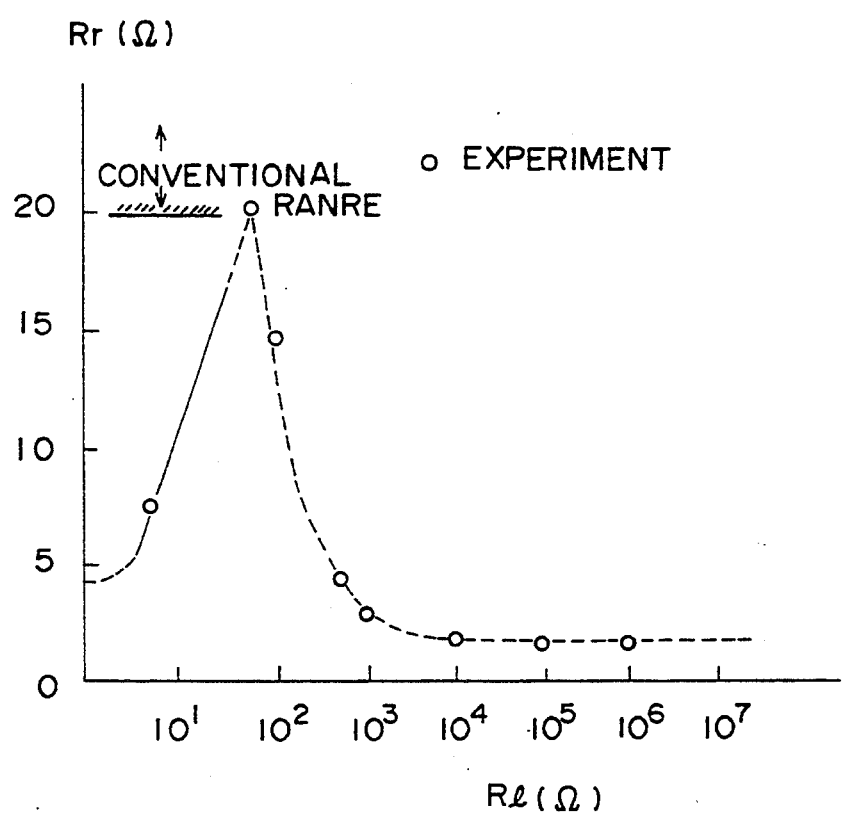
Figure 41:
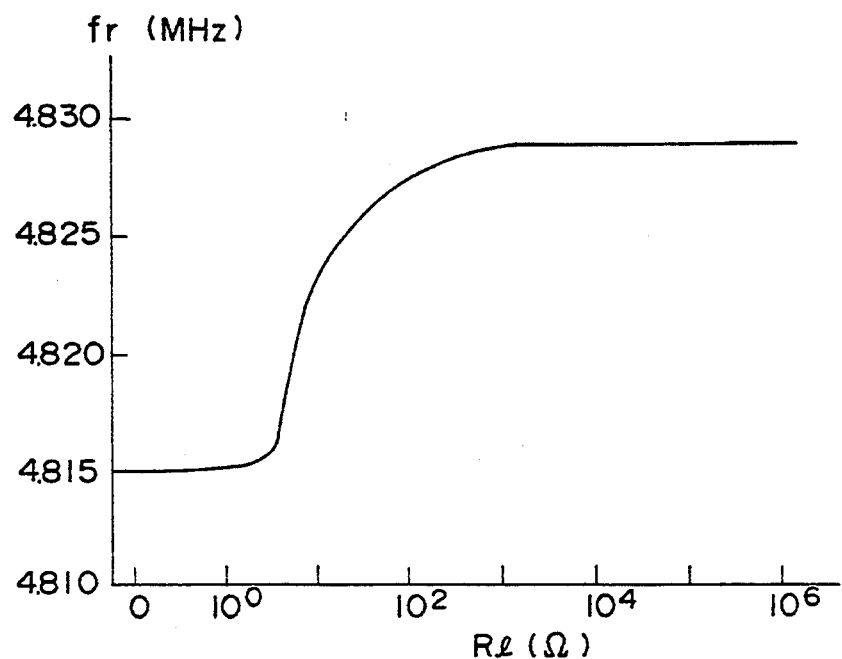
Figure 42:
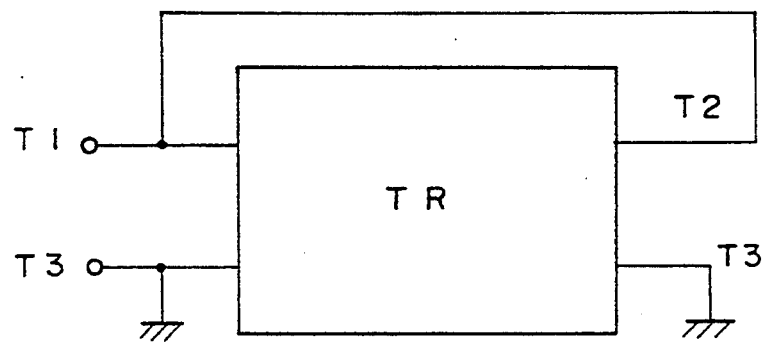
Figure 43:
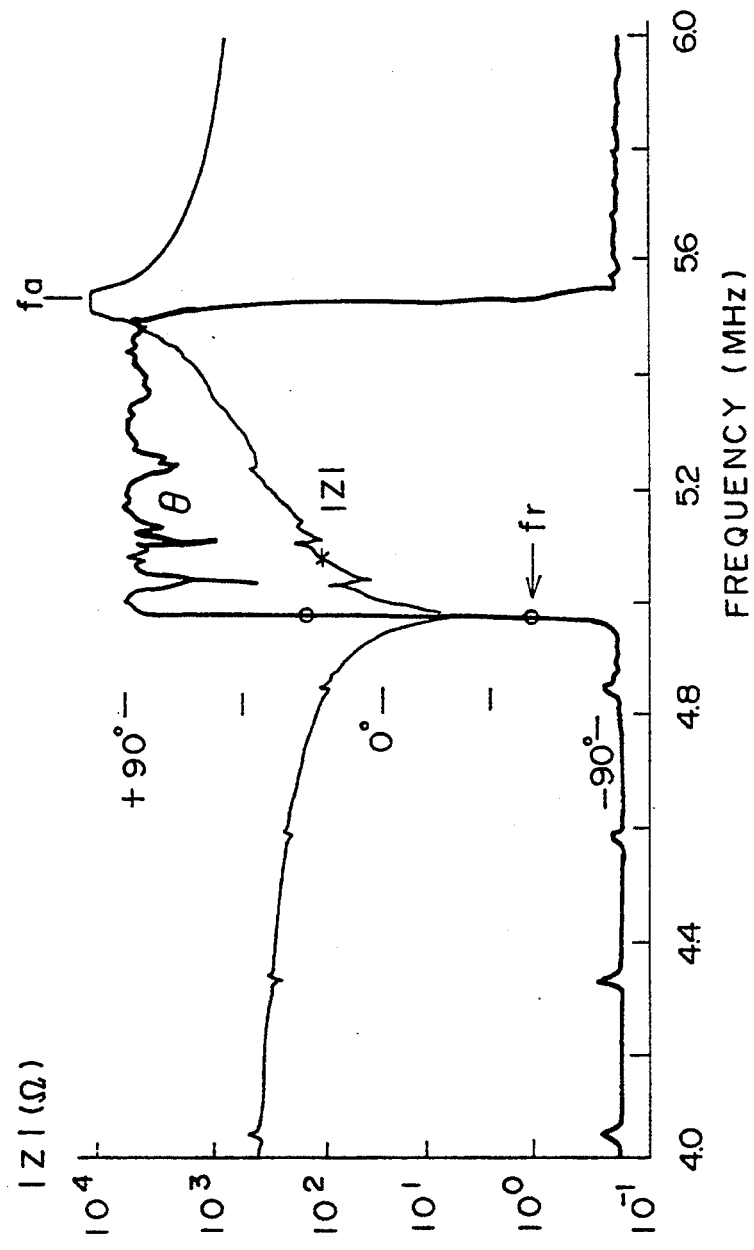
Figure 44A:
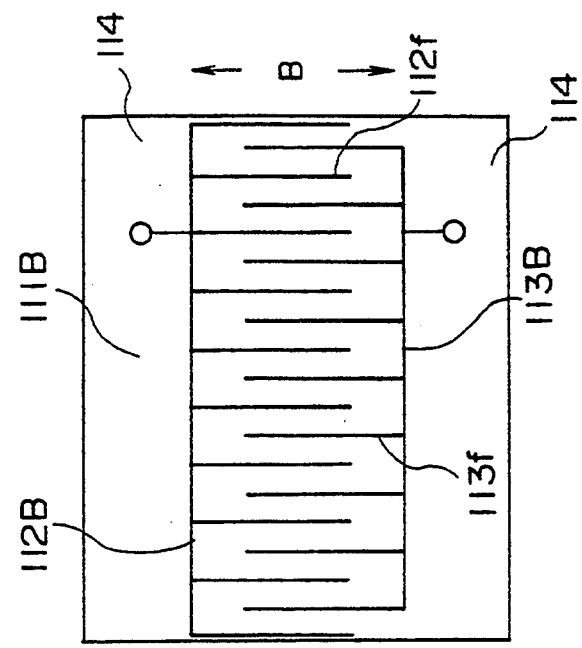
Figure 44B:
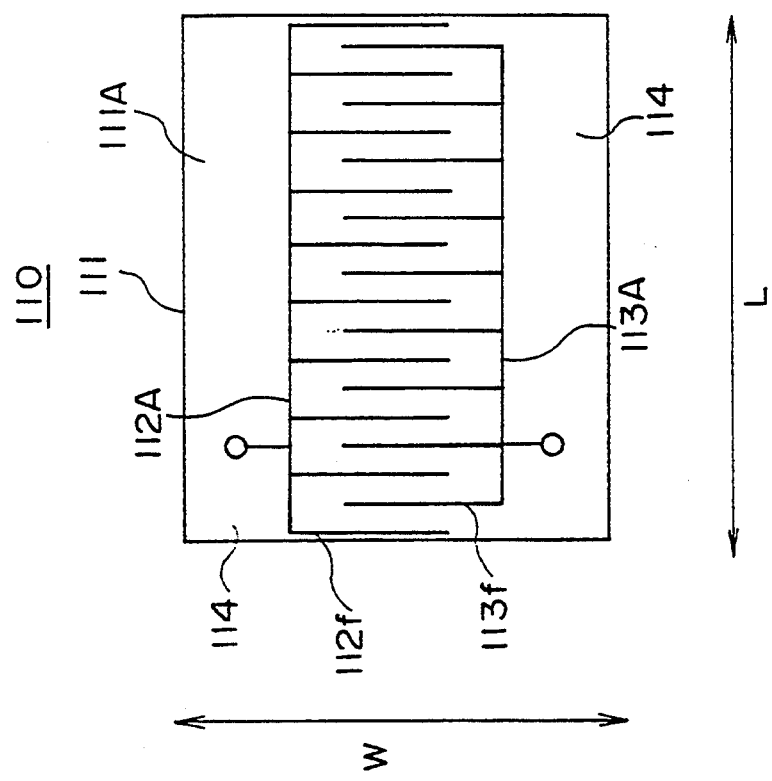
Figure 46:
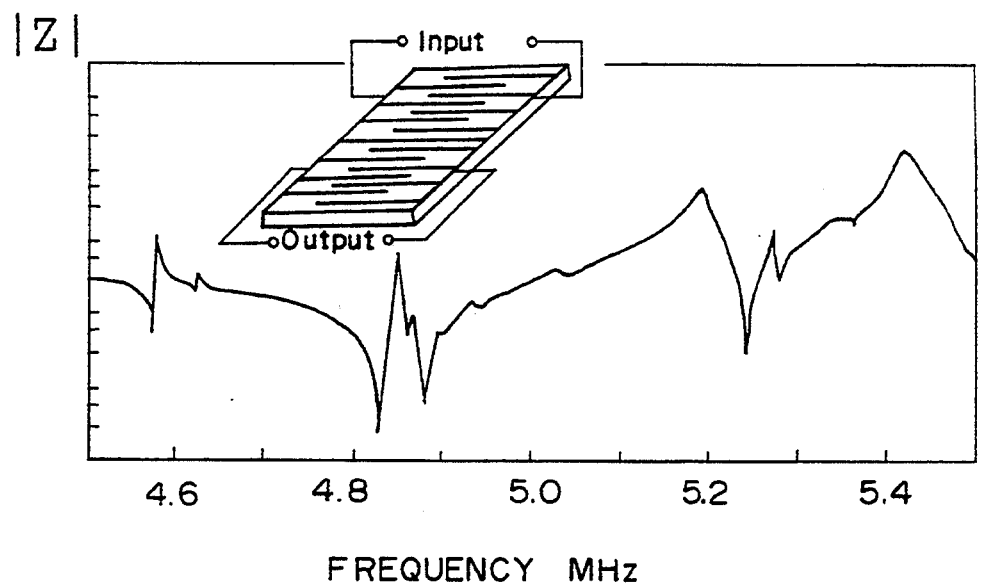
Figure 47:
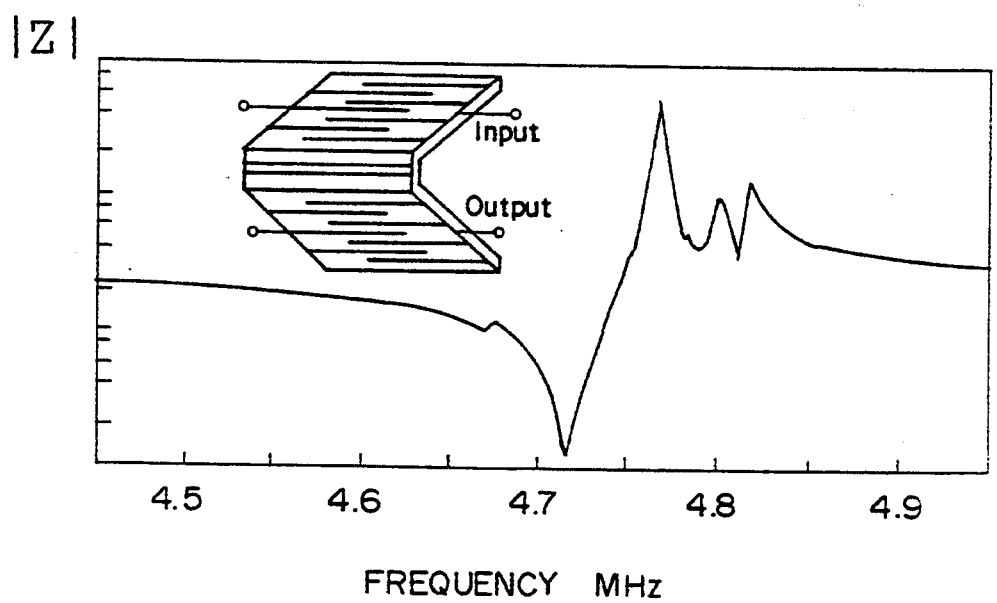
Figure 48:
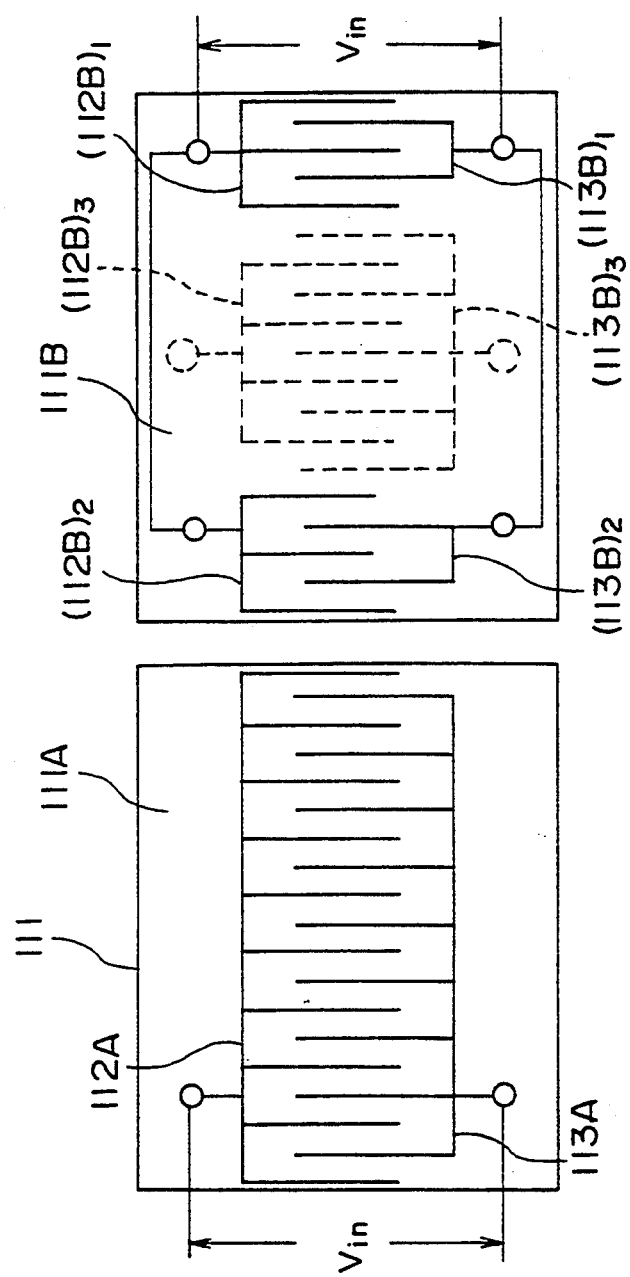
Figure 49:
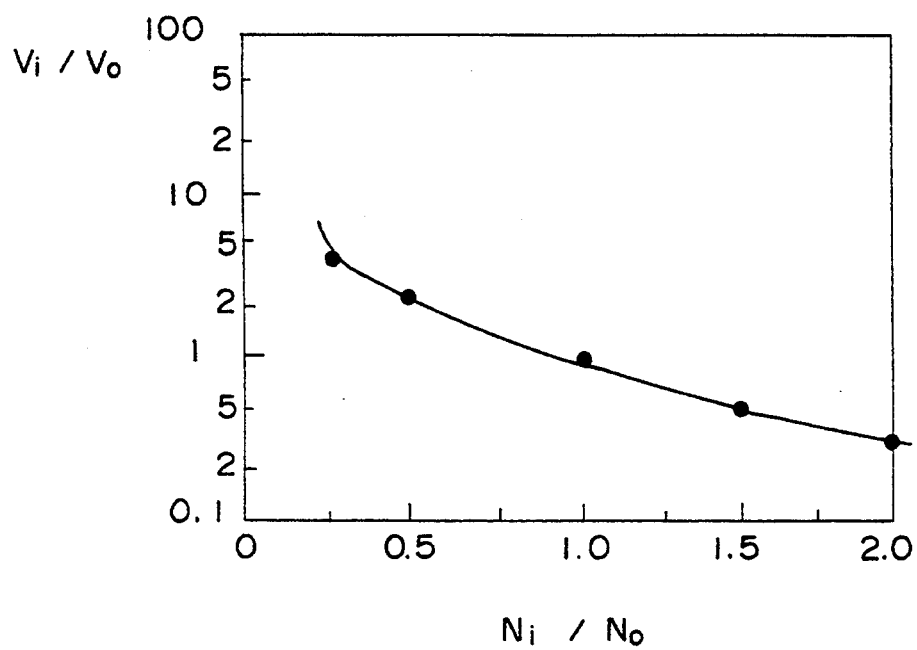
Figure 50:
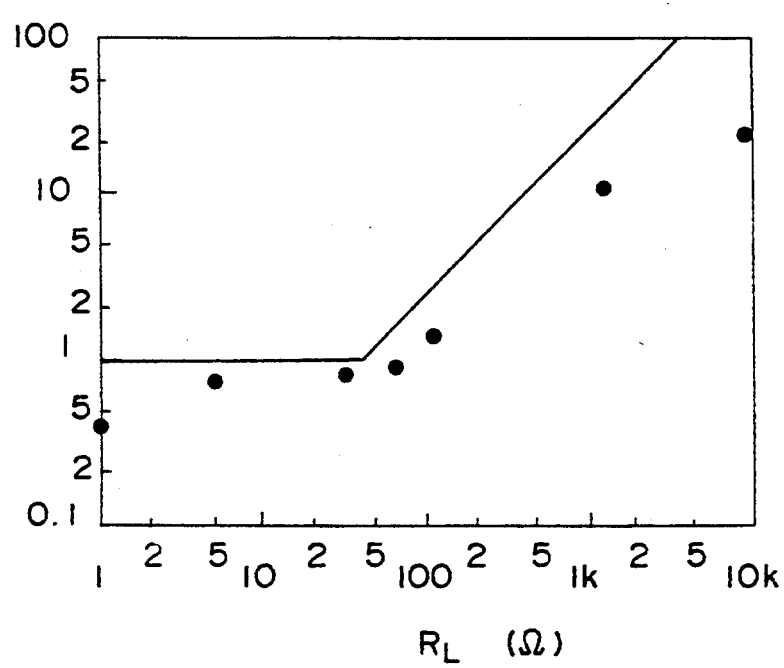
Figure 51:
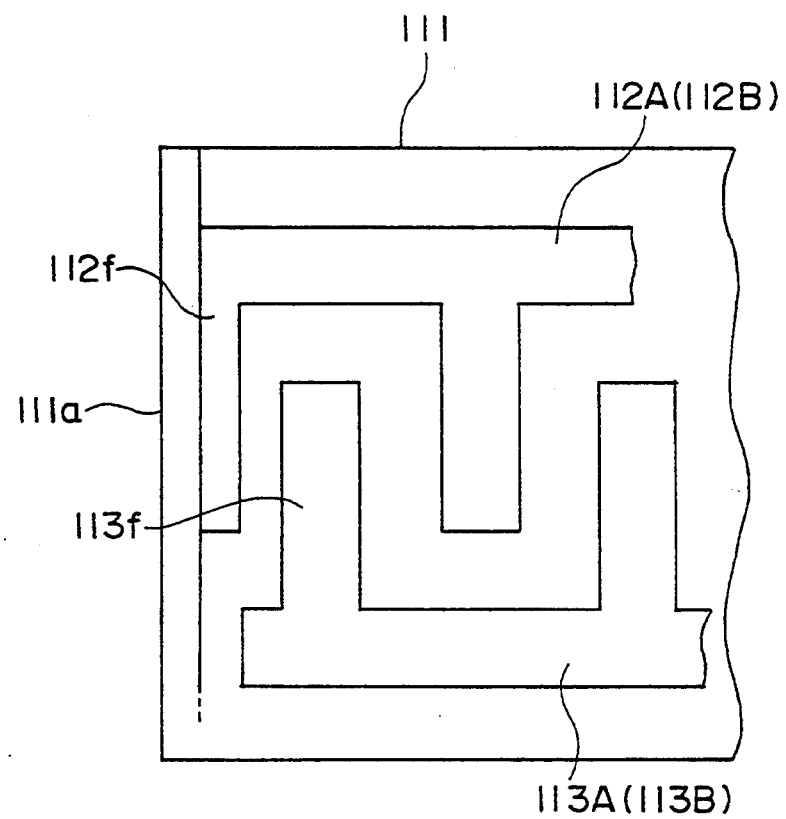
Figure 52:
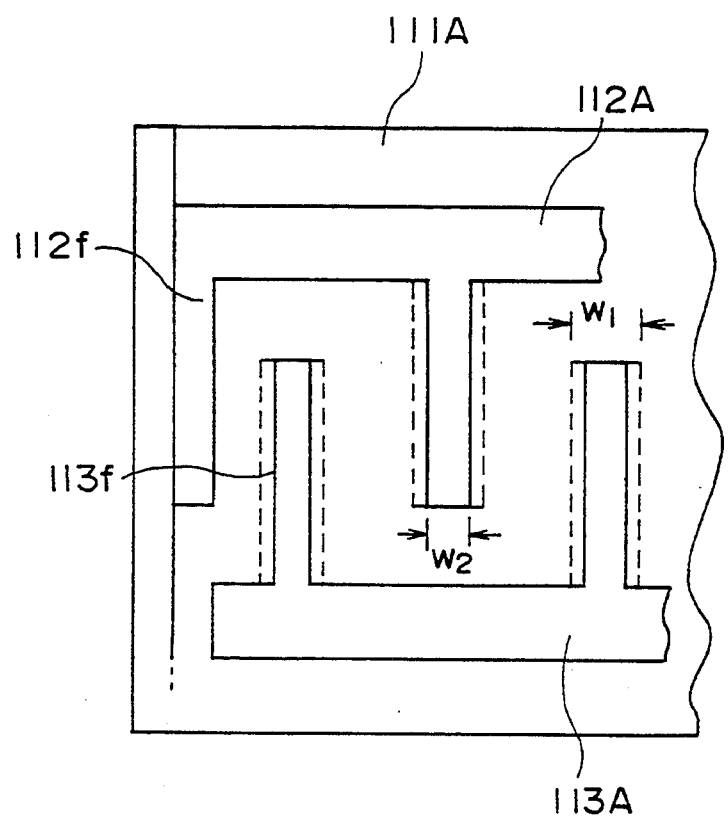
Figure 53:
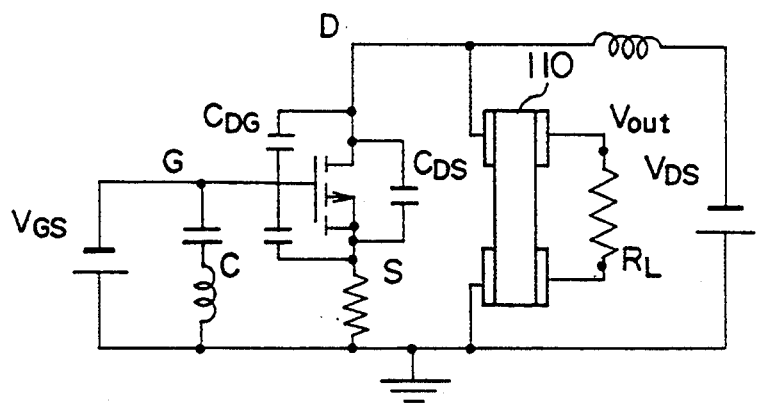
Figure 54:
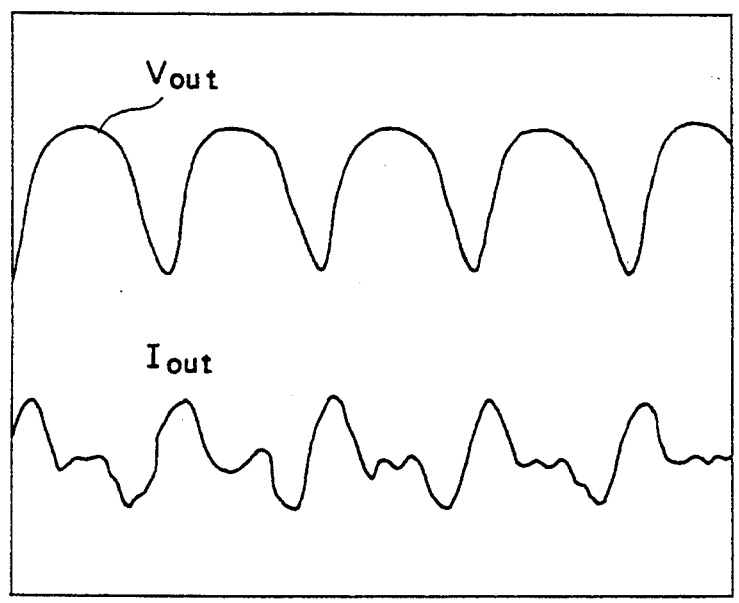

FIGS. 5(A)-5(C) are diagrams showing the characteristics of the piezoelectric transformer of the second example:

FIG. 6 is a diagram showing a first embodiment of the piezoelectric transformer according to the present invention:

FIG. 7 is a diagram showing the distribution of displacement and stress induced in the piezoelectric transformer of FIG. 6 in response to the excitation of a longitudinal elastic wave that in turn is caused by the transverse effect, for the case of a half-lambda operation;

FIGS. 8(A)-8(C) are diagrams showing the characteristics of the piezoelectric transformer of the first embodiment;

FIG. 9 is a diagram showing the step-up/step-down achieved by the piezoelectric transformer of the first embodiment;

FIG. 10 is a diagram showing a modification of the first embodiment;

FIGS. 11(A) and 11(B) are diagrams showing a full wavelength mode operation of the piezoelectric transformer of the first embodiment;

FIGS. 12(A)-12(C) are diagrams showing a second embodiment of the present invention;

FIGS. 13(A) and 13(B) are diagrams showing the operational characteristics of the piezoelectric transformer of the second embodiment:

FIGS. 14(A) and 14(B) are diagrams for explaining the step-up/step-down of the piezoelectric transformer of the second embodiment;

FIG. 15 is a diagram showing a third embodiment of the piezoelectric transformer according to the present invention;

FIGS. 16(A) and 16(B) are diagrams showing the step-up and step-down achieved by the piezoelectric transformer of the third embodiment;

FIG. 17 is a diagram showing a modification of the piezoelectric transformer of the third embodiment;

FIG. 18 is a diagram showing the step-up of the piezoelectric transformer of FIG. 17;

FIGS. 19(A) and 19(B) are diagrams showing a fourth embodiment of the piezoelectric transformer according to the present invention;

FIG. 20 is a diagram showing a lateral confinement of elastic energy achieved in the piezoelectric transformer of the fourth embodiment;

FIG. 21 is a diagram showing the increase in the power that can be handled by the piezoelectric transformer of the present invention with an increase in the width of a piezoelectric substrate used in the transformer;

FIG. 22 is a diagram showing a saturation occurring in the conventional piezoelectric transformers;

FIG. 23 is a diagram showing the change of the driving frequency with the change in the length of the piezoelectric transformer;

FIGS. 24(A) and 24(B) are diagrams showing a modification of the piezoelectric transformer of the fourth embodiment;

FIG. 25 is a diagram showing another modification of the piezoelectric transformer according to the fourth embodiment;

FIGS. 26(A) and 26(B) are diagrams showing still other modification of the piezoelectric transformer of the fourth embodiment;

FIG. 27 is a diagram showing a fifth embodiment of the piezoelectric transformer according to the present invention;

FIG. 28 is a diagram showing a modification of the piezoelectric transformer of the fifth embodiment;

FIG. 29 is a diagram showing another modification of the piezoelectric transformer of the fifth embodiment;

FIGS. 30(A) and 30(B) are diagrams showing the piezoelectric transformer according to a sixth embodiment of the present invention;

FIGS. 31(A)-31(C) are diagrams showing a seventh embodiment of the piezoelectric transformer according to the present invention;

FIGS. 32(A)-32(C) are diagrams showing a modification of the piezoelectric transformer of the seventh embodiment;

FIG. 33 is a diagram showing an eighth embodiment of the piezoelectric transformer according to the present invention in a plan view;

FIG. 34 is a diagram showing the piezoelectric transformer of the eighth embodiment in the perspective view:

FIG. 35 is a diagram showing the width-shear mode vibration used in the piezoelectric transformer of the eighth embodiment;

FIGS. 36(A)-36(C) are diagrams for explaining the operation of the piezoelectric transformer of the eighth embodiment;

FIGS. 37(A) and 37(B) are diagrams showing the frequency characteristics of the piezoelectric transformer of the eighth embodiment in comparison with the embodiments that use a longitudinal wave;

FIG. 37(C) shows an example of the connection of electrodes in the piezoelectric transformer of the present embodiment:

FIGS. 38(A)–38(D) are diagrams showing the frequency characteristics of the piezoelectric transformer of FIG. 37(C) for various connection and various load states;

FIG. 39 shows the step-up characteristic of the piezoelectric transformer of FIG. 37(C) as a function of the load;

FIG. 40 shows the input resistance of the piezoelectric transformer of FIG. 37(C) as a function of the load;

FIG. 41 shows the resonant frequency as a function of the load;

FIG. 42 shows a connection for use of the piezoelectric transformer of FIG. 37(C) as a piezoelectric oscillator;

FIG. 43 shows the impedance characteristic of the piezoelectric oscillator of FIG. 42;

FIGS. 44(A) and 44(B) are diagrams showing the piezoelectric transformer according to a ninth embodiment of the present invention;

FIGS. 45(A)–45(D) are diagrams showing the operation of the piezoelectric transformer of the ninth embodiment;

FIGS. 46 and 47 are diagrams for comparing the frequency characteristics of the piezoelectric transformer of the eighth embodiment and ninth embodiment;

FIG. 48 is a diagram showing a modification of the piezoelectric transformer of the ninth embodiment;

FIGS. 49 and 50 are diagrams showing the step-up/step-down characteristics of the piezoelectric transformer of the ninth embodiment;

FIG. 51 is a diagram showing a part of the device of the eights and ninth embodiments in an enlarged scale:

FIG. 52 is a diagram showing a modification of the eighth and ninth embodiments;

FIG. 53 is a circuit diagram showing a d.c./a.c. converter wherein the piezoelectric transformer of the ninth embodiment is used; and FIG. 54 is a diagram showing the waveform of the output voltage obtained by the circuit of FIG. 53.

DETAILED DESCRIPTION OF THE PREFERRED EMBODIMENT

FIG. 6 shows a first embodiment of the piezoelectric transformer according to a first embodiment of the present invention.

Referring to FIG. 6, the transformer has a substrate 31 of a 140° rotated Y-cut LiNbO$_3$ single crystal that is polarized uniformly in the Z-direction. This orientation is selected in correspondence to the maximum of the electromechanical coupling coefficient $k_{33}$ that contributes to the piezoelectric transverse effect. In FIG. 6, the direction of polarization is indicated by p. As will be noted, the polarization p points a direction oblique to the longitudinal direction of the substrate 31. Typically, the substrate 31 has a width W of 6 mm, a length L of 31.9 mm and a thickness t of 0.5 mm. As will be noted later, the length L of the substrate is set in accordance with the frequency of an input a.c. current that is supplied to the piezoelectric transformer.

On the substrate 31, there is provided an input electrode structure 32 in correspondence to a first longitudinal end thereof, wherein the electrode structure 32 includes a first input electrode 32a provided on the upper major surface of the substrate 31 and a second input electrode 32b provided on the lower major surface of the substrate 31 to oppose the first input electrode 32a. As illustrated in FIG. 6, the electrodes 32a and 32b extend in the longitudinal direction of the substrate 31 with a length $l_{01}$. Further, in correspondence to a second, opposite longitudinal end of the substrate 32, there is provided an output electrode structure 33 that includes a first output electrode 33a provided on the upper major surface of the substrate 31 with a length $l_{02}$ in the longitudinal direction and a second output electrode 33b provided on the lower major surface of the substrate 31 also with the length of $l_{02}$ in the longitudinal direction. Further, the input electrode structure 32 and the output electrode structure 33 are separated with each other in the longitudinal direction by a gap having a length $l_{03}$.

As is practiced commonly, the electrodes 32a, 32b, 33a and 33b are formed by depositing a layer of NiCr on the substrate 31 with a thickness of 30 nm and further depositing a layer of Au on the NiCr layer with a thickness of 100 nm. The deposition may be made by a vacuum evaporation deposition process or sputtering. After the deposition, the electrodes are formed by photolithographic patterning of the layers thus deposited. In the actual fabrication process, the NiCr layer and the Au layer are deposited uniformly on a single crystal wafer of LiNbO$_3$, and the individual piezoelectric transformers are obtained by dicing the wafer after the foregoing patterning of the electrodes.

In the example shown in FIG. 6, the length $l_{01}$ is set to 5.7 mm, while the length $l_{02}$ is set to 25.7 mm. The length $l_{03}$ is set to 0.5 mm. In other words, the piezoelectric transformer of FIG. 6 has the electrodes 33a and 33b that are larger in the longitudinal direction as compared with the electrodes 32a and 32b. However, the present invention is not limited to such a setting of the electrodes but includes the piezoelectric transformer of FIG. 10 wherein the electrodes 32a and 32b are set larger in the longitudinal direction as compared with the electrodes 33a and 33b. More specifically, the length $l_{01}$ is set to 25.7 mm while the length $l_{02}$ is set to 5.7 mm. Other dimensions including the length L, width W, the thickness t as well as the length $l_{03}$ of the gap are set identical with the embodiment of FIG. 6. Thus, the further description of the structure for the device of FIG. 10 will be omitted.

In operation, an input a.c. current is supplied to the input electrode structure 32 via input terminals 34a and 34b respectively connected to the electrodes 32a and 32b. Thereby, a longitudinal elastic wave is excited in the substrate 31 as a result of the piezoelectric transverse effect such that the longitudinal wave propagates in the longitudinal direction of the substrate. It should be noted that the orientation of the piezoelectric substrate 31 is set such that a maximum transverse effect is obtained in correspondence to the maximum of the electromechanical coupling coefficient $k_{33}$. Thereby, there is established a resonance in the substrate 31 in the longitudinal direction as shown in FIG. 7, wherein a continuous line represents the elastic displacement and a broken line represents the stress. It should be noted that, for this purpose, the longitudinal length L, defined as a sum of the lengths $l_{01}$, $l_{02}$ and $l_{03}$ of the substrate 31, has to be set equal to one half of the wavelength of the longitudinal wave that is excited in the substrate 31. In this device, too, the step-up/step-down operation is given by the foregoing Eq.(2).

FIGS. 8(A)-8(C) are diagrams similar to FIGS. 5(A)-5(C), showing the characteristics of the piezoelectric transformer as a function of the load resistance $R_1$. Similarly to the previous case, these relationships are obtained based upon the Mason's equivalent circuit model. In the drawings, the characteristics of the piezoelectric transformer shown in FIG. 6 are represented by a curve designated as "1," while the characteristics of the piezoelectric transformer shown in FIG. 10 represented by a curve designated as "2."

FIG. 8(A) shows the relationship between the resonant frequency $f_r$ of the piezoelectric transformer and the load resistance $R_1$ connected thereto. From FIG. 8(A), it will be seen that the resonant frequency $f_r$ increases stepwise at the load resistance of about $10^3 \Omega$ in the device of FIG. 6, while the device of FIG. 10 provides a constant resonant frequency $f_r$ irrespective of the value of the load resistance $R_1$.

FIG. 8(B) shows the relationship between the input resistance $R_r$ under the resonant state of the piezoelectric transformer and the load resistance $R_1$ connected thereto. From FIG. 8(B), it will be seen that there is a general tendency that the input resistance $R_r$ increases with the load resistance $R_1$ in the range of $R_1$ smaller than about $10^4 \Omega$, while the input resistance $R_r$ decreases with the load resistance $R_1$ when the load $R_1$ increases beyond about $10^4 \Omega$. Thereby, there appears a peak in the input resistance $R_r$ in correspondence to the load resistance $R_1$ of about $10^4$.

In FIG. 8(B), it should be noted that the characteristic curve designated as "1" for the device of FIG. 6 is located above the characteristic curve designated as "2" for the device of FIG. 10. Thereby, the input resistance $R_r$ of the device of FIG. 6 becomes larger than the load resistance $R_1$ connected thereto for the range of the load resistance $R_1$ in which the value of $R_1$ is smaller than about $10^4 \Omega$. When the load resistance $R_1$ exceeds $10^4 \Omega$, the input resistance $R_r$ becomes smaller than the load resistance $R_1$. On the other hand, for the device of FIG. 10, the input resistance $R_r$ is smaller than the load resistance $R_1$ for the entire range of $R_1$. It is believed that the foregoing boundary value of $R_r$ of $10^4 \Omega$ for the device of FIG. 6 is related to the step in the resonant frequency characteristic shown in FIG. 8(A).

FIG. 8(C) shows the step-up/step-down operation of the piezoelectric transformer of the present embodiment. As represented by the curve "1," the piezoelectric transformer of FIG. 6 shows the step-down in the range of $R_1$ smaller than about $10^5 \Omega$ close to the foregoing boundary value of $10^4$. Thus, when the load resistance $R_1$ connected to the piezoelectric transformer of FIG. 6 is smaller than $10^4$–$10^5 \Omega$, the piezoelectric transformer shows the step-down operation, while when the load resistance $R_1$ is larger than the foregoing range, the piezoelectric transformer of FIG. 6 shows the step-up operation.

In the case of the piezoelectric transformer of FIG. 10, the situation is different. As represented by the curve "2," the piezoelectric transformer shows the step-up operation even when a small load resistance $R_1$ smaller than $10^4$–$10^5 \Omega$ is connected to the output electrodes 33a and 33b, wherein the step-up ratio increases steeply when the value of load resistance $R_1$ has exceeded the foregoing value of $10^4$–$10^5 \Omega$. In the example of the device of FIG. 10, a step-up ratio of 10 is obtained in the range of $R_1$ smaller than $10^4 \Omega$, and this step-up ratio remains constant even when the value of the load resistance $R_1$ is decreased further.

FIG. 9 shows the relationship between the step-up ratio $V_o/V_i$ and the ratio of length of the output electrode and the input electrode ($l_{02}/l_{01}$). This relationship is obtained for the device having the dimension of the piezoelectric substrate set identical with the device of FIGS. 6 and 10.

As shown in FIG. 9, the ratio $V_o/V_i$ changes generally linearly with the ratio $l_{02}/l_{01}$ and crosses the value 1.0 in correspondence to the ratio $l_{02}/l_{01}$ of 1.0. Thereby, the piezoelectric transformer shows the step-up operation in the range of $l_{02}/l_{01}$ of smaller than 1.0, while the transformer shows the step-down operation in the range of $l_{02}/l_{01}$ of larger than 1.0. Thus, the piezoelectric transformer of the present embodiment provides the desired step-up or step-down operation by setting the length and hence the area of the input electrode and the output electrode unequal.

Referring to the structure of the piezoelectric transformer of FIGS. 6 and 10 again, the piezoelectric transformer has been excited by the a.c. current with a frequency set such that there is established a half-wavelength resonance in the piezoelectric substrate 31 as shown in FIG. 7. In other words, the total length L of the substrate 31 is set equal to one-half the wavelength of the elastic wave that is excited in the piezoelectric substrate 31. In such a half-wavelength resonance, there appears a node of vibration in correspondence to the longitudinal center of the substrate 31, and a mechanical support 37 is provided in correspondence to the longitudinal center for supporting the substrate 31 mechanically such that the substrate 31 can vibrate freely.

In such a half-lambda excitation mode, however, there appears a problem in that the vibrational energy tends to escape through interconnection leads 34a and 34b or 35a and 35b, as these interconnection leads are provided in correspondence to the part of the substrate wherein the amplitude of vibration is finite.

In order to eliminate this problem, the piezoelectric transformer of the present invention can be driven in the full-wavelength mode, wherein the total length L of the piezoelectric substrate 31 is set equal to one wavelength of the elastic wave that is induced in the substrate.

FIGS. 11(A) and 11(B) show the full-wavelength mode of the piezoelectric transformer of the present embodiment, wherein there is provided an input electrode 32a' on the upper major surface of the substrate 31 in correspondence to a first longitudinal end thereof with a length of L/2. On the other hand, there is provided an output electrode 33a' also on the upper major surface of the substrate 31 in correspondence to a second, opposite longitudinal end with a length of L/4. In correspondence to this, there is formed a gap of the size of L/4 on the upper major surface of the substrate 31 in correspondence to a part located between the electrode 32a' and the electrode 33a'. Further, there is provided a backside electrode 32b' on the entire lower major surface of the substrate 31, wherein the backside electrode 32b' is used commonly for the input electrode and the output electrode as will be described.

In response to the application of the input a.c. voltage across the input electrodes 32a' and 32b', there occurs an elastic vibration as shown in FIG. 11(B) wherein a longitudinal elastic wave propagating in the longitudinal direction is induced with a wavelength corresponding to the longitudinal length L of the substrate 31. Thereby, three appears a node of vibration in correspondence to the longitudinal position of the substrate 31 of L/4 and 3L/4 as shown in FIG. 11(B). In FIG. 11(B), the distribution of the elastic displacement is represented by the continuous line, while the distribution of the stress is represented by the broken line.

In the device of FIG. 11(A), it will be seen that the input leads 34a and 34b are connected to the electrodes 32a' and 32b' in correspondence to the node of vibration. Further, the output lead 35a is connected to the electrode 33a' at its edge in correspondence to another node of vibration. The electrode 32b' is used also for the output electrode, as the output lead 35b is connected to the electrode 32b' commonly with the input lead 34b.

In the present embodiment, the electric leads are connected to the corresponding electrodes at the node of vibration. Thereby, the loss of elastic energy via the leads is minimized. As there are a plurality of nodes in the single substrate, it will be understood that the concentration of stress at the node is reduced as compared with the driving mode shown in FIG. 7 wherein there is only single node in the substrate. It should be noted that the stress applied to the substrate becomes maximum in correspondence to the node. Thus, the full-wavelength mode of the piezoelectric transformer is preferable particularly when driven by a large power. In this device, on the other hand, there is a problem in that the size of the electrodes is fixed and hence the step-up ratio is fixed.

FIGS. 12(A)–12(B) show a piezoelectric transformer 40 according to a second embodiment of the present invention for eliminating the problem of the loss of elastic energy via the lead wires and simultaneously providing a desired step-up ratio.

Referring to FIG. 12(A) showing the piezoelectric transformer 40 of the present invention in the perspective view, the piezoelectric transformer includes a substrate 41 of 140° rotated-Y cut single crystal of $LiNbO_3$ with a length L in the longitudinal direction, a width W in the transverse direction and a thickness t similarly to the foregoing embodiment. On the upper and lower major surfaces of the substrate 41, a pair of mutually opposing electrodes 44a and 44b are provided in correspondence to a first longitudinal end of the substrate 41 for receiving the input a.c. current. Further, a pair of opposing electrodes 45a and 45b are provided in correspondence to another, second longitudinal end of the substrate for producing the output a.c. current.

As shown in FIGS. 12(B) and 12(C) respectively showing the piezoelectric transformer in the plan view and bottom view, the electrode 44a is provided on the upper major surface of the substrate 41 to extend from the edge corresponding to the first longitudinal end with a length of L/2. In correspondence to this, the electrode 44b is provided on the lower major surface of the substrate 41 to extend with the same length of L/2. Thereby, there extends a node of vibration in the transverse direction of the substrate in correspondence to the longitudinal center of the electrodes 44a and 44b as shown by a broken line 42, and the electrodes 44a and 44b are formed with input terminals $44a_1$ and $44b_1$ that extends laterally from the substrate 41 in correspondence to the node.

In the present embodiment, the electrode 45a is provided on the upper major surface of the substrate 31 in correspondence to a node 43 located close to the second end of the substrate 41 with a size 2T in the longitudinal direction of the substrate such that the electrode 45a extends in the direction of the first end, with respect to the node, by a length T and in the direction of the second edge by the same length T. Further, in correspondence to the node, there is provided a terminal $45a_1$ for external connection such that the terminal $45a_1$ projects laterally from the substrate 41. The electrode 45b also has a similar construction and provided in correspondence to the node with the size of 2T. Similar to the terminal $45a_1$, the electrode 45b is provided with a terminal $45b_1$ that projects laterally form the substrate 41.

In the present embodiment, the loss of elastic energy via the electric interconnection is avoided by setting the terminals $44a_1$ and $44b_1$, $45a_1$ and $45b_1$ respectively in coincidence to the node of vibration. Although not shown, one may provide a pillar of conductor such as solder on a circuit board on which the piezoelectric transformer is to be mounted. In such a case, one can mount the piezoelectric transformer by mounting the terminals $44a_1$–$45b_1$ on these conductor pillars. Thereby, such conductor pillars not only provide the electric connection but also a mechanical support of the piezoelectric transformer. Further, the construction of the piezoelectric transformer of the present invention allows various sizes for the electrodes 45a and 45b by setting the size T suitably. Thereby, one can obtain various step-up/step-down ratio in correspondence to the size of the electrodes 45a and 45b.

FIGS. 13(A) and 13(B) show the frequency characteristics of the input current and output voltage obtained for the device that has the length L of the substrate 41 set to 2.5 mm (L=2.5 mm) and the size 2T of the electrodes 45a and 45b set to 156 μm, under the condition that a load of 100 Ω is connected across the electrodes 45a and 45b.

FIG. 13(A) shows the output voltage for the case where an input a.c. current is supplied to the electrodes 44a and 44b with a voltage of 1 V. As will be seen, there appears an output voltage of about 3.9 volts with an output current of $150 \times 10^3$ mA at the output electrodes $45a_1$ and $45b_1$, when the frequency of the input a.c. current is set to 2.2358 MHz in correspondence to one full wave standing in the substrate 41 in the longitudinal direction. This result indicates that the transfer of the electric energy from the primary side to the secondary side occurs only at a particular resonant frequency, and one obtains a step-up ratio of 3.9 when the size 2T of the output electrodes 45a and 45b is set to about ⅛ of the length L/2 of the input electrodes 44a and 44b.

FIGS. 14(A) and 14(B) show the relationship between the step-up ratio $V_o/V_i$ and the size 2T of the output electrodes 45a and 45b, wherein FIG. 14(A) defines the parameter and FIG. 14(B) shows the observed step-up ratio. As can be seen clearly from FIG. 14(B), the step-up ratio changes with the size 2T of the output electrode, wherein there appears a maximum in correspondence to the value of 2T of about 0.14. When the size 2T of the output electrode is set to this value, the step-up ratio exceeds 4.

FIG. 15 shows a piezoelectric transformer 50 according to a third embodiment of the present invention.

Referring to FIG. 15, the piezoelectric transformer 50 of the present invention includes a piezoelectric substrate 51 of a 140° rotated-Y cut single crystal of $LiNbO_3$, wherein the substrate 51 has a width W that is set larger than a longitudinal length L, contrary to the preceding embodiments. In the present embodiment, the width W is set to 31.9 mm while the length L is set to 6.0 mm. On the other hand, the substrate 51 has a thickness t that is set to 0.5 mm.

In correspondence to the elongated shape of the substrate 51 in the lateral direction rather than in the longitudinal direction, the input and output electrodes provided on the substrate 51 are also elongated in the lateral direction. In the typical example, there are provided input electrodes 52a and 52b respectively on the upper major surface and the lower major surface with a width B and a length $L_{01}$. See FIG. 15. Further, on the upper and lower major surfaces of the substrate 51, output electrodes 53a and 53b are provided respectively, wherein only the electrode 53a can be seen in FIG. 15. The electrode 53a has a width C and a length $L_{02}$, wherein the width C is substantially smaller than the width B. The electrode 53b, though not shown, is provided on the lower major surface of the substrate 51 in correspondence to the electrode 53a. Thereby, the output electrodes 53a and 53b have an area that is substantially smaller than the area of the input electrodes 52a and 52b. Further, the electrode 52a is separated from the electrode 53a by a distance $L_{03}$. Similarly, the electrode 52b is separated from tile electrode 53b by the same distance $L_{03}$.

In operation, the electrodes 52a and 52b excite the longitudinal elastic wave propagating in the direction L as a result of the piezoelectric transverse effect, and the elastic wave thus excited is converted to the electric voltage by the electrodes 53a and 53b. Similarly to the previous embodiments, the length L of the substrate 51 is set equal to a half-wavelength or one full wavelength of the elastic wave that is excited in the substrate 51.

FIGS. 16(A) and 16(B) show the step-up characteristics and the input resistance of the piezoelectric transformer respectively for the case where a low resistance of 200 Ω is connected across the output electrodes 53a and 53b as the load resistance $R_L$ and for the case where a high resistance of 60 Ω is connected as the load resistance $R_L$. The result shown in FIGS. 16(A) and 16(B) are for the device that has the size $L_{01}$ and the size $L_{02}$ of 1.2 mm ($L_{01}=L_{02}=1.2$ mm). Similarly to the previous embodiments, the characteristic curves of FIGS. 16(A) and 16(B) are obtained based upon the Mason's equivalent circuit.

As can be seen in FIGS. 16(A) and 16(B), the step-up ratio $V_o/V_i$ changes with the ratio C/B, wherein the step-up ratio exceeds 1 and reaches about 10 even when a small output resistance $R_L$ is connected. Particularly, when the ratio C/B is less than 0.1, the step-up ratio exceeds 10 and the input resistance $R_i$ becomes almost zero. This result indicates that the foregoing step-up operation of the piezoelectric transformer is obtained as a result of unequal area of the input electrodes 52a, 52b and the output electrodes 53a, 53b rather than the length $L_{01}$ and $L_{02}$.

FIG. 17 shows a piezoelectric transformer 50' corresponding to a modification of the third embodiment, wherein an isolated electrode 56a and another isolated electrode 56b (not shown) are provided in correspondence to the part of the upper and lower major surfaces of the substrate 51 where the electrode is not provided in the embodiment of FIG. 15. Thus, the electrode 56a and 56b are provided to oppose with each other with the substrate 51 intervening therebetween. The electrodes 56a and 56b are not connected to anywhere and act merely as an auxiliary mass for balancing the acoustic vibration such that the elastic wave is induced uniformly in the width direction of the substrate 51.

FIG. 18 shows the step-up characteristics of the piezoelectric transformer of FIG. 17 as well as the input resistance as a function of the load resistance $R_L$. As can be seen in FIG. 18, the piezoelectric transformer of FIG. 17 shows the step-up ratio larger than 10 even when a load resistance $R_L$ smaller than 100 Ω is connected. It can be seen also that the input resistance $R_i$ of less than 100 Ω is realized by reducing the load resistance $R_L$.

FIGS. 19(A) and 19(B) show a piezoelectric transformer 60 according to a fourth embodiment of the present invention in the plan view.

Referring to FIG. 19(A) showing the plan view, the piezoelectric transformer 60 of the present embodiment has a substrate 61 of 140° rotated-Y cut single crystal LiNbO$_3$, wherein the substrate 61 has a width W and a length L wherein the width W is set at least two times as large as the length L (W>2L). Here, L is set equal to one wavelength of the longitudinal elastic wave in the direction of L. As already noted, one can establish the longitudinal elastic wave efficiently by the transverse effect, by taking the orientation of the substrate 61 as above.

In correspondence to the central part of the substrate 61, with respect to the direction of W, an input electrode 62a and an output electrode 62b are provided in alignment in the direction of L, respectively with the length of $l_{01}$ and $l_{02}$, with a gap of the size of $l_{03}$ formed therebetween. There, the electrodes 62a and 63a have a common width B that is substantially smaller than the width W. Preferably, the width W is set at least three times as large as the width B (W>3B). Further, interconnection pads 64a and 65a are formed on the upper major surface of the substrate 61 respectively in connection with the electrodes 62a and 63a.

In correspondence to the electrodes 62a and 63a, electrodes 62b and 63b are provided on the lower major surface of the substrate 61 with the size identical with the corresponding electrodes 62a, 63a as shown in the cross sectional view of FIG. 19(B). Thus, the electrode 62b has width and length identical with the width B and the length $l_{01}$ while the electrode 63b has width and length identical with the width B and the length $l_{02}$. Similarly to the interconnection pads 64a and 65a, corresponding interconnection pads 64b and 65b are formed on the lower major surface of the substrate 61 respectively in connection with the electrodes 62b and 63b.

In the present embodiment, too, the electrodes 62a and 62b excite a longitudinal elastic wave propagating in the direction L as a result of the piezoelectric transverse effect, and the electrodes 63a and 63b convert the elastic wave to the electric voltage. Similarly to the previous embodiments, the piezoelectric transformer of the present embodiment shows the step-up/step-down action by setting the ratio $l_{01}/l_{02}$ appropriately.

In the piezoelectric transformer of the present embodiment, it should be noted that the velocity of the elastic wave propagating through the substrate 61 is reduced in correspondence to the part underneath the electrodes 62a, 62b, 63a and 63b because of the piezoelectric reaction. More specifically, when an input current source is connected across the electrodes 62a and 62b and an output load connected across the electrodes 63a and 63b, the space charges that are induced in the substrate 61 in correspondence to the passage of the elastic wave are dissipated immediately, and the elastic constant of the substrate is reduced apparently.

Thereby, the velocity of the elastic wave is reduced as compared with the region where no electrode is provided. Further, the electrode itself acts as an additional mass to the substrate, and such an increase In the mass also contributes in reducing the velocity of the elastic wave. This effect is known as the mass load effect. In the case of longitudinal wave, it is well known that the LiNbO$_3$ crystal shows the sound velocity $v_D$ of 6,830 m/sec when no electrode is provided thereon, while the crystal shows the sound velocity $v_E$ of 5,560 m/sec when the electrode is provided and a constant electric field is applied. It should be noted that the size L of the substrate 61 is set such that the substrate establishes a resonance with the one full-wavelength of the elastic wave having the velocity $v_E$.

When there is formed a low velocity region to extend in the direction of L through the substrate 61, it will be understood that there is a confinement of elastic energy in the low velocity region. In other words, the elastic wave is channeled along the low velocity region or channel region of the substrate on which the electrodes 62a, 62b, 63a and 63b are provided.

FIG. 20 shows the amplitude distribution profile of the elastic wave in the substrate taken in the direction of W. As will be understood from this diagram, the amplitude of the elastic vibration decreases sharply in the region outside the part where the electrodes are provided. In other words, the elastic energy is confined in the central region where the electrodes are provided and no substantial loss of energy occurs when the substrate 61 is supported mechanically at the marginal part. In other words, the piezoelectric transformer of the present embodiment provides the possibility of handling a large electric power.

FIG. 21 shows the output electric power $P_o$ that can be taken out from the piezoelectric transformer of the present embodiment as a function of the width W of the substrate 61. It will be seen that the electric power $P_o$ increases with increasing width W of the substrate 61. In order to make sure that the elastic energy does not escape from the marginal part of the substrate, it is preferable to set the width W at least four times as large as the wavelength of the elastic wave excited in the substrate 61.

FIG. 22 shows, for the purpose of comparison, the relationship between the output voltage $V_o$ and the input voltage $V_i$ for the device that has a support mechanism that supports the central part of the piezoelectric substrate. In this device, there occurs a audible noise when the input voltage $V_i$ has exceeded about 10 volts, and the rate of increase of the output voltage $V_o$ with the input voltage $V_i$ reduces significantly. This indicates that a loss occurs possible in the form of audible noise.

FIG. 23 shows the relationship between the length L of the substrate 61 and the resonant frequency $f_r$. It should be noted that the frequency $f_r$ decreases with increasing length L, showing that the piezoelectric transformer can handle the high frequency input by reducing the size L.

FIG. 24(A) and 24(B) show a piezoelectric transformer 60' according to a modification of the fourth embodiment, wherein insulating films 66a and 66b of silicon oxide, aluminum oxide or silicon nitride are provided respectively on the upper and lower major surfaces of the substrate 61, and the electrodes 62a and 63a are provided on the insulating film 66a. The electrodes 62b and 63b, on the other hand, are provided on the insulating film 66b. Thereby, the insulating films 66a and 66b act as the additional mass for reducing the velocity of the elastic wave in the substrate 61 further. Thereby, a more efficient confinement of elastic energy can be achieved as compared with the embodiment of FIGS. 19(A) and 19(B).

FIG. 25 shows a piezoelectric transformer 60'' according to another modification of the present embodiment, wherein the electrodes 62a and 63a on the upper major surface of the substrate 61 as well as electrodes 62b and 63b on the lower major surface of the substrate 61 are respectively embedded in insulating films 66a' and 66b'. In this case, too, one can enhance the confinement of the elastic energy by the mass load effect. In the present modification, the dielectric strength across the input and output electrodes is also improved.

FIGS. 26(A) and 26(B) show a still other modification of the present embodiment, wherein both drawings show the substrate 61 viewed from the upward direction. As can be seen, terminal pads 64a' and 65a' are formed on the upper major surface of the substrate 61 respectively in connection with electrodes 62a and 63a while terminal pads 64b' and 65b' are provided on the lower major surface of the substrate 61 respectively in connection with electrodes 62b and 63b. As both drawings are seen from the same direction, the conductor strip connecting the electrode 62a to the pad 64a' extends in a direction opposite to the conductor strip that connects the electrode 62b to the terminal pad 65b'. Similarly, the conductor strip connecting the electrode 63a to the pad 65a' extends in a direction opposite to the conductor strip that connects the electrode 63b to the pad 64b'. Thereby, the excitation of elastic waves by the electric field that is applied across the conductor strips, is avoided effectively.

FIG. 27 shows a piezoelectric transformer 70 according to a fifth embodiment of the present invention, wherein the confinement of elastic energy is achieved in the piezoelectric substrate in correspondence to the region wherein the input and output electrodes are provided similar to the fourth embodiment.

Referring to FIG. 27, the piezoelectric transformer 70 includes a piezoelectric substrate 71 similar to the substrate 61 with input electrodes 72a and 72b provided respectively on the upper and lower major surfaces of the substrate 71 in correspondence to the electrodes 62a and 62b of the fourth embodiment. The input electrodes 72a and 72b have a width B. In the plan view of FIG. 27, the electrode 72b at the lower major surface cannot be seen. Further, output electrodes 73a and 73b having the same width B are provided on the upper and lower major surfaces of the substrate 71 in correspondence to the electrodes 63a and 63b, wherein the electrode 73b cannot be seen in FIG. 27.

In the present embodiment, the longitudinal size L of the substrate 71 is decreased toward the lateral end in the direction W such that there are formed tapered edges T except for the part where the electrodes are provided. Thereby, the tapered edges T are formed in correspondence to two diagonal lines, and the resonance does not occur at the part of the substrate 71 located at both lateral sides of the electrodes. Thus, the occurrence of large amplitude vibration in correspondence to these parts is avoided. Thus, the piezoelectric transformer of the present invention provides a further improved confinement of elastic energy in a channel region formed underneath the electrodes. Similarly to the previous embodiments, one can obtain desired step-up ratio by setting the length $l_{o1}$ and $l_{o2}$ of the electrodes appropriately. It is obvious that the device of the present embodiment can be supported without substantial loss of energy, by supporting the lateral edges of the substrate 71 where there is no substantial vibration.

FIG. 28 shows a piezoelectric transformer 70' according to a modification of the present embodiment, wherein the tapered edges T are formed on only one of the diagonal lines of the substrate 71. As the effect that the present construction achieves is obvious from the foregoing explanation, further description of the device of FIG. 28 will be omitted.

FIG. 29 shows a piezoelectric transformer 70" according to another modification of the present embodiment, wherein the piezoelectric substrate 71 is formed in the shape of a cross, wherein a pair of lateral projections C are formed in correspondence to the longitudinal center of the region that carries thereon the electrodes 72a and 72b and extending in the longitudinal direction with the length L. In this modification, too, the resonance of elastic wave does not occur in the projections C and the effective confinement of the elastic wave in the channel region under the electrodes is achieved.

FIGS. 30(A) and 30(B) show a piezoelectric transformer assembly 100 according to a sixth embodiment of the present invention, wherein the piezoelectric transformer of the previous embodiments such as the transformer 60 of FIG. 19(A) is supported on a silicon substrate 101.

In correspondence to the general center of the substrate 101, there is provided a depression 101a wherein various driver circuits and other circuits 102 are accommodated. Further, a land 60a is provided on the lower major surface of the substrate 61 in correspondence to four corners thereof, and the piezoelectric transformer 60 is held on the silicon substrate 101. Thereby, a land 101b is formed on the upper major surface of the silicon substrate 101 in correspondence to the land 60a of the piezoelectric transformer 60, and the transformer 60 is held on the substrate 101 with a separation therefrom in correspondence to the projecting size of the land 60a and the land 101b. The land 60a and the corresponding land 101b may be soldered with each other. Alternatively, one may hold the substrate 61 of the piezoelectric transformer 60 on the silicon substrate 101 by means of a flexible lead that holds the marginal part of the piezoelectric substrate 61.

As the piezoelectric substrate 61 is held at the marginal part thereof, the loss of elastic energy does not occur and the efficiency of transfer of the electric power from the primary side to the secondary side is significantly improved. In a preferred embodiment, one may protect the piezoelectric transformer 60 on the substrate 101 by a cover 103.

FIGS. 31(A)-31(C) show a piezoelectric transformer 80 according to a seventh embodiment of the present invention, wherein FIG. 31(A) shows the plan view and FIG. 31(B) shows a longitudinal cross section together with the connection of electrodes. FIG. 31(C), on the other hand, shows a modification of the present embodiment in the longitudinal cross section.

Referring to the plan view of FIG. 31(A), it will be seen that the piezoelectric transformer 80 has a substrate 81 of a 140° rotated-Y cut single crystal of LiNbO$_3$ and has the length L, the width W and the thickness t as illustrated, wherein the length L is set equal to an integer multiple of half-wavelength of the longitudinal elastic wave that is excited in the substrate 81 and propagating in the longitudinal direction.

On the upper major surface of the substrate 81, there are provided a number of strip electrodes 82a and 83a in correspondence to the maximum stress induced by the elastic wave as shown in FIG. 31(A), wherein the electrodes 82a and 83a are formed alternately. It should be noted that the thick continuous line in FIG. 31(A) shows the stress distribution in the substrate 81.

Each electrode of the electrodes 82a and 83a has a width B in the lateral direction W of the substrate 81 such that the width B is set substantially smaller than the width W of the substrate 81 in correspondence to the confinement of elastic energy explained with reference to FIG. 20. Further, each electrode 82a has a length $l_{01}$ in the longitudinal direction L of the substrate while each electrode 83a has a length $l_{02}$ in the longitudinal direction, wherein the length $l_{02}$ is set generally different from the length $l_{01}$.

In correspondence to each electrode 82a on the upper major surface of the substrate 81, a number of strip electrodes 82b are provided on the lower major surface of the substrate with the width B and the length $l_{01}$. Similarly, a number of strip electrodes 83b are provided on the lower major surface of the substrate 81 in correspondence to the electrode 83a with the width B and the length $l_{02}$. Again the electrodes 82b and 83b are disposed alternately respectively in correspondence to the positive and negative maximum of the stress that is caused in the substrate 81 as a result of the piezoelectric transverse effect.

In the present embodiment, it will be understood that there are formed a number of nodes corresponding to the maximum elastic stress in the substrate 81 in correspondence to each electrode. In other words, there are formed a plurality of locations wherein the concentration of stress occurs in the present embodiment. Thereby, the concentration of stress at a single location as in the stress distribution of FIG. 7 is avoided, and the piezoelectric transformer of the present embodiment can handle an electric power that is substantially larger than the previous embodiments. Further, the power that can be processed by the piezoelectric transformer of the present embodiment increases generally linearly with the length L of the substrate 81. Alternatively, the foregoing increase of the power can be achieved by increasing the frequency of the input a.c. current or using the higher order harmonic.

FIG. 31(B) shows an example of connection of the electrodes, wherein all the electrode sets 82a and 82b are connected parallel and all the electrode sets 83a and 83b are connected parallel. By choosing the ratio of the length $l_{01}$ and $l_{02}$ appropriately, one can obtain a desired step-up ratio $\phi$.

FIG. 31(C) shows a modification of the present embodiment, wherein upper and lower electrodes 82a' and 82b' corresponding to the electrodes 82a and 82b are provided consecutively in correspondence to a first region of the substrate 81. Further, upper and lower electrodes 83a' and 83b' corresponding to the electrodes 83a and 83b are provided consecutively in correspondence to a second region of the substrate 81. Here, the first region and the second region are aligned in the longitudinal direction of the substrate 81.

In the present embodiment, too, each electrode is provided in correspondence to the maximum of stress or the node of vibration in the substrate 81 and has the same width B. On the other hand, all the electrodes 82a'–83b' may have the same length in the longitudinal direction of the substrate. The step-up ratio is thereby changed by changing the number of the input electrode pair 82a' and 82b' with respect to the number of the output electrode pair 83a' and 83b'.

FIGS. 32(A) and 32(B) show another modification of the piezoelectric transformer of the present embodiment, wherein one input electrode pair consisted of the electrodes 82a and 82b and one output electrode pair consisted of the electrodes 83a and 83b are provided to locate adjacent with each other in correspondence to half wavelength of the elastic wave excited in the piezoelectric substrate 81. There, the electrodes 82a and 82b as well as the electrodes 83a and 83b at the left half of tile substrate 81 are provided in correspondence to the elastic displacement in one direction, while the electrodes at the right half of the substrate are provided in correspondence to the elastic displacement in the other direction. Further, the electrode 82a at the left and the electrode 82a at the right are connected with each other, the electrode 82b at the left and the electrode 82b at the right are also connected with each other. Similarly, the electrode 83a at the left and the electrode 83a at the right are connected with each other, and the electrode 83b at the right and the electrode 83b at the left are connected with each other.

FIG. 32(C) shows another modification, wherein the length L of the substrate 81 is set equal to 3/2 times the wavelength of the elastic wave that is excited in the substrate 81.

FIG. 33 shows a piezoelectric transformer 90 according to an eighth embodiment of the present invention.

Referring to FIG. 33 showing the plan view, the piezoelectric transformer 90 includes a piezoelectric substrate 91 having a rectangular form with the length L in the longitudinal direction or Y'-direction and the width W in the transverse direction or Z'-direction.

On the upper major surface of the substrate 90, a number of strip electrodes are provided to extend parallel with each other in the Z'-direction that is defined perpendicular to the Y'-direction on the plane of the upper major surface of the substrate 91. The electrodes are grouped into three electrode groups $E_1$, $E_2$ and $E_3$, wherein the electrodes of the group $E_1$ are used for the input electrode while the electrodes of the group $E_2$ are used for the output electrode as will be described later. The electrodes of the group $E_3$ is provided between a pair of adjacent electrodes that form the electrode group $E_1$ or the electrode group $E_2$. Further, the electrodes of the group $E_3$ are connected commonly with each other to the ground, although the group $E_3$ electrodes are not essential for the operation of the device. It should be noted that the electrodes are provided only on the upper major surface of the substrate 91 and there is no electrode provided on the lower major surface.

Each electrode has a length $l_{01}$ in the longitudinal direction of the substrate 91 and extends in the Z'-direction with a length B in correspondence to the transverse center of the substrate, as illustrated in FIG. 33. Thereby, marginal areas M are formed at both lateral sides of the region that is covered by the electrodes. On these marginal areas M, there are provided terminal pads in correspondence to each electrode.

In the illustrated example, the substrate 91 is formed of a single crystal of LiNbO$_3$ of 163°±10° Y-rotated X-cut orientation for the effective excitation of the width-shear vibration as will be explained later. The length L of the substrate 91 is set to 15.2 mm in correspondence to 19 wavelengths of the shear wave that is induced in the substrate, while the width W is set to 8 mm. Further, the thickness of the substrate 91 is set to 0.2–0.3 mm. The size 101 of the electrode is set to 0.2 mm, and the electrodes are provided with a mutual separation of 0.1 mm.

FIG. 34 shows the principle of the piezoelectric transformer of the present embodiment. For the sake of simplicity of explanation, only the essential elements are illustrated.

Referring to FIG. 34, an input a.c. voltage $V_i$ is applied across a pair of adjacent electrodes of the group $E_1$. Thereby, an electric field acting in the Y'-direction that coincides with the direction of the polarization is applied on the surface of the substrate 91. When such a particular electric field is applied on the substrate 91 that has the above mentioned orientation, a width-shear vibration is excited effectively in correspondence to the large electromechanical coupling constant $k_{15}$. It should be noted that the substrate 91 of the foregoing orientation provides the factor $k_{15}$ of 61% of the maximum electromechanical coupling constant. Alternatively, one may use a single crystal of LiTaO$_3$ of the −48°±10° rotated Y-cut orientation. In this case, a value of 0.47% is obtained for the electromechanical coupling constant $k_{15}$. Further, one may use a piezoelectric ceramic for the substrate 91. In this case, the ceramic substrate is polarized in the Y'-direction or longitudinal direction.

FIG. 35 shows the width-shear vibration caused in the substrate 91 as a result of the excitation shown in FIG. 34.

Referring to FIG. 35, there is excited a shear wave propagating in the longitudinal direction Y' as a result of the electric excitation of FIG. 34, wherein the shear wave causes the displacement in the substrate 91 in the transverse direction as illustrated in FIG. 35 by the arrows. The shear wave propagates in the Y'-direction back and forth and establishes a resonance as schematically illustrated in FIGS. 36(A)–36(C), wherein FIG. 36(A) shows a schematic plan view of the piezoelectric transformer, FIG. 36(B) shows the elastic displacement, and FIG. 36(C) shows the stress distribution. About the width-shear vibration, reference should be made to Watanabe, H. and H. Shimizu, "Energy Trapping of Higher-Harmonic Width Vibrations in Piezoelectric Strips and Its Application to Filters," The Transactions of The Institute of Electronics, Information And Communication Engineers A, Vol.J71-A, No.8, pp.1489–1498, August, 1988, which is incorporated herein as reference. In FIGS. 36(A)–36(C), it will be noted that there are provided two electrodes ($E_{11}$ and $E_{12}$, $E_{21}$ and $E_{22}$) for each of the electrode group $E_1$ and the electrode group $E_2$, and the length L of the substrate 91 is set to 6/2 times the wavelength of the shear wave that is excited in the substrate. As shown in FIG. 36(C), each electrode forming the electrode group $E_1$ as well as each electrode forming the electrode group $E_2$ on the substrate 91 are provided in correspondence to the node where the stress is maximum.

In the example shown in FIG. 33, on the other hand, there are provided 19 electrodes in correspondence to 19 waves formed in the substrate 91 under the resonant state. In the device of FIG. 33, it was observed that the piezoelectric transformer has the resonant frequency $f_r$ of about 4.835 MHz when the number of electrodes included in the E1 group is set equal to the number of electrodes included in the E2 group. In this construction, the electrode at the longitudinal center is connected to the ground and nine electrodes are included in each of the first group $E_1$ and the second group $E_2$. See the connection shown in FIG. 37(C).

FIG. 37(A) shows the relationship between the input impedance and the frequency of the input a.c. current for the device of FIG. 33. As noted above, the measurement was made for the state of the device shown in FIG. 37(C) wherein nine electrodes are included for both the electrode group $E_1$ and the electrode group $E_2$.

Referring to FIG. 37(A), it will be seen clearly that the device of FIG. 37(C) shows a resonance at about 4.8 MHz as indicated by the sharp drop of the input impedance. At the resonant frequency, it was observed that the input impedance or input resistance $R_r$ has decreased to about 1–1.2 $\Omega$. From this diagram, it will be noted that the characteristic curve is relatively smooth, with reduced number of spurious peaks. This reduced spurious is believed to be obtained as a result of use of the slow shear wave for the piezoelectric excitation. When the longitudinal wave having a higher velocity is used, there appears resonance for both the longitudinal wave and the shear wave in the characteristic as shown in FIG. 37(B). In both of the measurements of FIG. 37(A) and FIG. 37(B), terminals $T_1$ and $T_2$ (defined in FIG. 37(C)) were connected together to form a hypothetical input terminal and the electric excitation was applied across the input terminal thus formed and a terminal $T_3$ connected to the ground. In other words, the result of FIGS. 37(A) and 37(B) show the impedance characteristic of the piezoelectric transformer acting as an oscillator. The use of the device of the present invention as a piezoelectric oscillator will be described later.

Figure 38C:
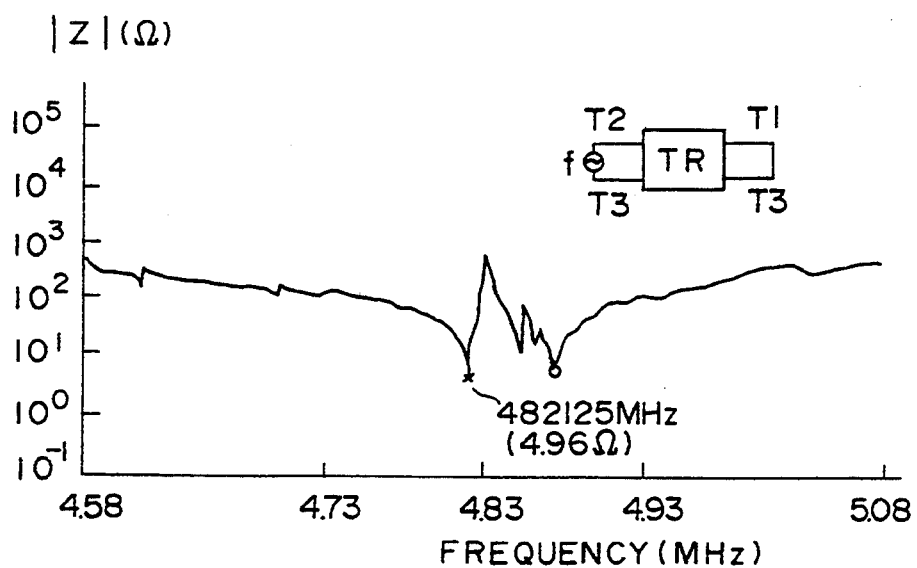
Figure 38D:
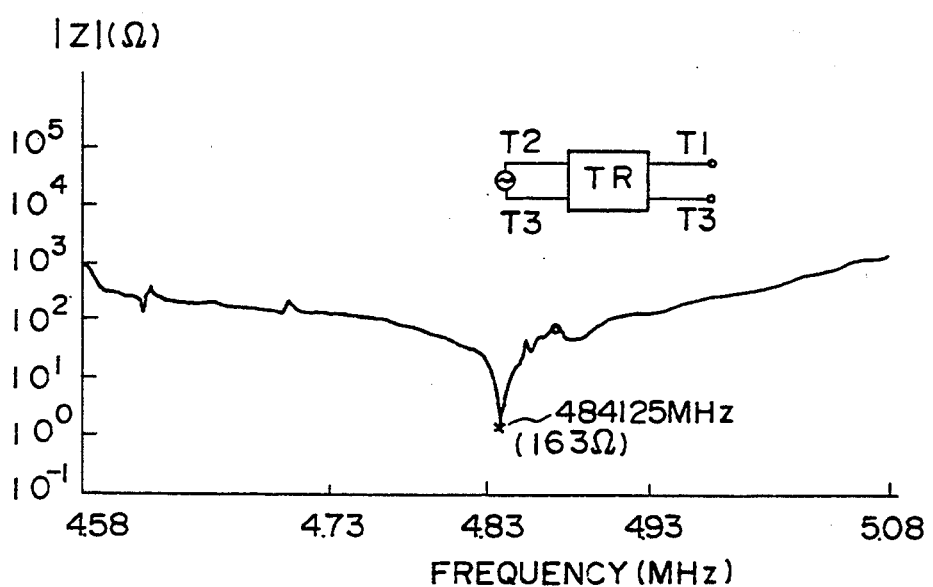

FIGS. 38(A)–38(D) show the detailed input impedance-frequency characteristic of the piezoelectric transformer of the present embodiment, wherein FIG. 38(A) shows the characteristic curve for the case where the output terminals $T_2$ and $T_3$ of the transformer defined in FIG. 37(C) are shorted while FIG. 38(B) shows the characteristic curve for the case where no load is connected across the output terminals $T_2$ and $T_3$. On the other hand, FIG. 38(C) shows the case where the input a.c. current is supplied to the terminals $T_2$ and $T_3$ while the terminals $T_1$ and $T_3$ are shorted. Further, FIG. 38(D) shows the case similar to FIG. 38(C) except that no load is connected across the terminals $T_2$ and $T_3$.

In the case of FIG. 38(A), it will be seen that the resonant frequency $f_r$ takes a value of about 4.82 MHz and the magnitude $|Z|$ of the input impedance for the resonant state takes a value of 2.82 $\Omega$. In the case of FIG. 38(B), on the other hand, the resonant frequency $f_r$ becomes to about 4.84 MHz and the input impedance takes a value of about 1.38 $\Omega$. Further, in the case of FIG. 38(C), the resonant frequency $f_r$ becomes to about 4.82 MHz while the input impedance takes a value of about 4.96 $\Omega$. In the case of FIG. 38(D), the resonant frequency $f_r$ becomes to about 4.84 MHz and the input resistance at the resonance state takes a value of 1.63 $\Omega$. Thus, the piezoelectric transformer of the present embodiment provides an extremely small input resistance at the resonant frequency and is capable of transferring a large electric power from the primary side to the secondary side. It should be noted that the output power of the piezoelectric transformer is given as $P_o = \frac{1}{2} \cdot V_o^2/R_e$, wherein $R_e$ represents the real part of the complex impedance $Z$ ($R_e = |Z|\cos\Theta$). It will be seen that the term $P_o$ increases with the reduction of the input impedance $|Z|$.

FIG. 39 shows the step-up characteristic for the device of FIG. 37(C) as a function of the load resistance $R_l$, while FIG. 40 shows the input resistance for the same device as a function of the load resistance $R_l$. As can be seen in this drawing, the piezoelectric transformer shows the input resistance $R_r$ of the order of about 20 $\Omega$ in the maximum for the entire range of the load resistance $R_l$. Except for the particular range of $10^1$–$10^3$ $\Omega$ of the load resistance $R_l$, the input resistance $R_r$ is held smaller than 5 $\Omega$.

Finally, FIG. 41 shows the relationship between the resonant frequency $f_r$ and the load resistance $R_l$. It will be seen that the resonant frequency $f_r$ remains substantially constant except for the value of $10^1$–$10^2$ $\Omega$.

In the piezoelectric transformer of the present embodiment, it will be noted that the size of the device can be reduced as a result of use of the slow shear wave, of which velocity is about 80% of the velocity of the longitudinal wave. Further, as there is no mode of elastic wave that is slower than the shear wave, occurrence of unwanted spurious is minimized as clearly demonstrated in FIG. 37(A). Further, the device of the present embodiment is advantageous for fabrication, as the electrodes are provided only on one side of the piezoelectric substrate. As a result of use of the substrate that provides a large electromechanical coupling coefficient $k_{15}$, the width-shear vibration is excited efficiently in the substrate. Further, effective confinement of the elastic energy occurs under the electrodes similarly to the case of FIG. 20. Thereby, the loss of energy during the operation of the transformer is minimized. Similar to the embodiments of FIGS. 24(A), 24(B) and 25, one may provide additional mass in correspondence to the electrodes to enhance the effect of lateral confinement of energy. Further, one can obtain a desired step-up ratio in the device of FIG. 33 by setting the number of electrodes in the electrode group $E_1$ appropriately with respect to the number of electrodes included in the electrode group $E_2$.

It should be noted that the piezoelectric transformer of FIG. 37(C) can be used also for the piezoelectric oscillator as described with reference to the characteristic of FIG. 37(A).

FIG. 42 shows the connection used in the device of FIG. 37(C) to realize the piezoelectric oscillator of the present embodiment. As shown in FIG. 42, the output terminal $T_2$ is connected to the input terminal $T_1$ while the terminal $T_3$ is connected to the ground. The electric excitation is applied across the terminal $T_1$ and the terminal $T_3$.

FIG. 43 shows a detailed characteristic curve for the device of FIG. 42. It should be noted that the characteristic curve is essentially identical with the characteristic curve of FIG. 37(A). Thus, the device of the present embodiment has a resonance frequency $f_r$ of 4.975 MHz with the input resistance $R_r$ of 1.08 $\Omega$. The minute difference for the value of $f_r$ and $R_r$ from the value of FIG. 37(A) arises due to the different sample of the device used for the measurement. Further, the impedance curve shows the anti-resonant frequency $f_a$ at 5.53 MHz with the anti-resonant input resistance $R_a$ of 54.3 K$\Omega$.

FIG. 43 also shows the phase component of the impedance $Z$ as a function of the frequency. It should be noted that the phase angle component becomes almost 90° in the range of frequency between $f_r$ and $f_a$ indicating that the device of FIG. 42 operates as a near ideal oscillator. It should be noted further that the large difference between the frequency $f_r$ and $f_a$ as large as 0.55 MHz indicates that the piezoelectric oscillator of the present embodiment provides a wide range of changing the oscillation frequency.

Next, a piezoelectric transformer according to a ninth embodiment of the present invention will be described with reference to FIGS. 44(A) and 44(B).

Referring to the drawings, the device of the present embodiment is constructed on a piezoelectric substrate 111 of a LiNbO$_3$ single crystal having the 163° Y-rotated X-cut orientation, wherein electrodes 112A, 113A, 112B and 113B are provided on upper and lower major surfaces 111A and 11B of the substrate.

The substrate 111 has a width W in the lateral direction and a length L in the longitudinal direction, wherein the electrodes 112A and 113A are provided on the upper major surface 111A while the electrodes 112B and 113B are provided on the lower major surface. The electrode 112A includes a number of fingers 112f each extending in the lateral direction of the piezoelectric substrate 111 with a length B that is substantially smaller than the lateral width W of the substrate. Similarly, the other electrode 113A has a number of fingers 113f to extend also laterally in the opposite direction to the finger 112f, and the fingers 112f and 113f are disposed alternately along the longitudinal direction of the substrate 111. Thereby, the electrodes 112A and 113A form a mutually opposing interdigital electrode. The electrodes 112B and 113B provided on the lower major surface 111B of the substrate 111 have a similar construction wherein finger electrodes 112f or 113f are arranged to oppose with each other and repeated alternately in the longitudinal direction of the substrate 111.

In operation, the input voltage is applied across the electrodes 112A and 113A on the upper major surface 111A, and an elastic wave propagating in the longitudinal direction of the substrate 111 is excited. When the LiNbO$_3$ single crystal having the 163° Y-rotated X-cut orientation is used for the substrate 111, a width-shear vibration is induced efficiently. Of course, elastic wave of any other mode may be induced by using a different piezoelectric substrate including a ceramic substrate.

Similarly to the construction of FIGS. 19(A) and 19(B), such a construction causes a reduction in the velocity of the elastic wave in correspondence to the laterally-central part of the substrate 111 wherein the interdigital electrodes are provided. Thereby, an efficient confinement of the elastic energy is obtained along the central part of the substrate 111 and the device of the present embodiment can be supported without causing loss of energy by holding the laterally-marginal part of the substrate 111.

In the device of FIGS. 44(A) and 44(B), it will be noted that the elastic wave thus excited is reflected back and forth at both longitudinal edges of the substrate 111 to establish a standing wave, wherein the finger electrodes 112f and 113f are provided in correspondence to the node of vibration where the elastic stress becomes maximum. Further, the elastic wave thus excited is detected by the interdigital electrodes 112B and 113B at the lower major surface 111B. By providing the electrodes on both the upper and lower major surfaces 111A and 111B to cover substantially the entire length L, it was discovered that the device of the present invention can successfully minimize the spurious components from the output voltage obtained at the electrodes 112B and 113B.

Figure 45A:
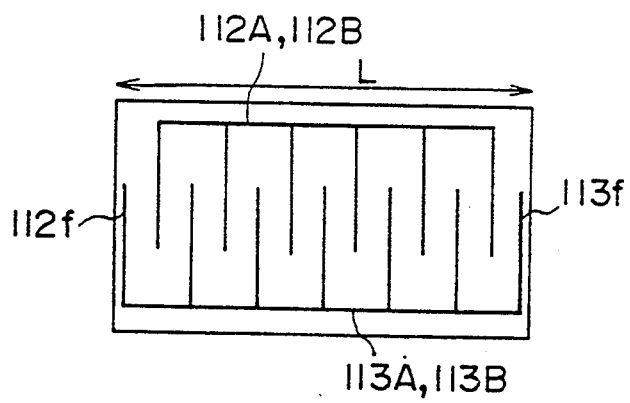
Figure 45B:
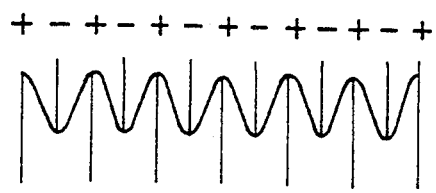
Figure 45C:
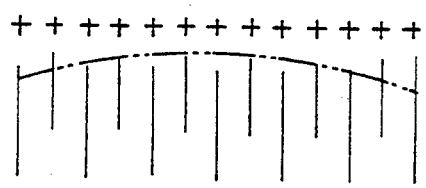
Figure 45D:
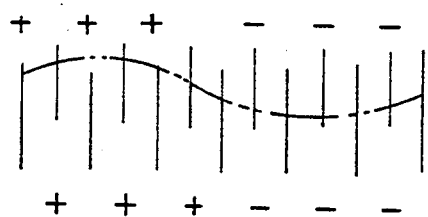

FIGS. 45(A) and 45(B) show the excitation of the elastic wave in the device of the present embodiment, wherein it will be noted that the fingers 112f and 113f are disposed on the substrate with a pitch corresponding to one-half the wavelength of the elastic wave. Thereby, it will be noted in FIG. 45(B) that positive and negative electric excitations are applied alternately for substantially the entire length L of the substrate 111a when an excitation voltage is applied across the electrodes 112A and 113A, and an elastic wave having the wavelength of L/n is excited efficiently, wherein n represents the number of waves excited in the substrate 111 in the longitudinal direction thereof. In the illustrated example, the number n of the waves is six. On the other hand, excitation of other modes such as those shown in FIGS. 45(C) and 45(D) are effectively suppressed. It should be noted that the spurious excitation shown in FIG. 45(C) or FIG. 45(D) is suppressed when the excitation voltage is applied as shown in FIG. 45(B).

With this regard, the piezoelectric transformer of the present invention is advantageous for eliminating spurious components from the output voltage over the device described previously such as the device of FIG. 33. In the device of FIG. 33, it will be noted that the alternate excitation is applied only on a part of the interdigital electrodes E$_1$ while the rest of the interdigital electrodes E$_2$ are used for detecting the elastic vibration. In order to detect the elastic vibration, the present invention uses the interdigital electrodes 112B and 113B provided on the lower major surface 111B as the output electrode. In the width shear vibration or other plate waves that are excited by the interdigital electrodes, it should be noted that an elastic displacement substantially identical with the elastic displacement on the upper major surface of the substrate appears on the lower major surface. Thus, by providing the pickup electrode 112B and 113B at the lower major surface of the substrate 111, one can detect the elastic vibration applied to the upper major surface of the substrate.

FIGS. 46 and 47 show the frequency characteristics of the piezoelectric transformer in the state wherein the output electrodes 112B and 113B are shorted, in which FIG. 46 shows the characteristics corresponding to the device of FIG. 34 while FIG. 47 shows the characteristics for the device of the present embodiment. Thus, FIG. 46 corresponds to FIG. 38(A) explained previously, wherein the device used for measurement in the experiment of FIG. 46 shows a noticeable resonance at a frequency of about 4.55 MHz. By providing the lower interdigital electrodes 112B and 113B and applying an electric excitation over the entire length of the substrate 111 as shown in 45(B), it will be noted that the foregoing undesirable resonance is almost entirely eliminated in the device of the present embodiment. Thus, the piezoelectric transformer of the present invention is extremely useful for obtaining output a.c. voltage with reduced distortion. In the characteristics of FIG. 47, it was shown that one can achieve the input resistance of less than several ohms.

In the present embodiment, there is another advantageous feature in that one can supply a very large input power to the piezoelectric transformer without causing a damage thereto. Obviously, this desirable feature is obtained from the construction for distributing the input electric excitation over the entire length of the substrate rather than concentrating the same at a limited area.

FIG. 48 shows the construction applicable to the device of the present embodiment for changing the step-up/step-down ratio. In the device of FIGS. 44(A) and 44(B), it will be noted that one cannot achieve the desired step-up or step-down as long as the number of the fingers is identical in the input interdigital electrode and the output interdigital electrode. In the device of FIG. 48, a part of the interdigital electrodes such as the electrodes $(112B)_1$, $(113B)_1$, $(112B)_2$ and $(112B)_2$ are used also for the input electrode by applying the input a.c. voltage. More specifically, the input a.c. voltage is applied also across the electrodes $(112B)_1$ and $(113B)_1$ and across the electrodes $(112B)_2$ and $(113B)_2$, in addition to the electrodes 112A and 113A at the upper major surface 111A. Thereby, the output voltage is obtained between the interdigital electrodes $(112B)_3$ and $(113B)_3$.

FIG. 49 shows the step-up/step-down ratio $V_i/V_o$ achieved by the piezoelectric transformer of FIG. 48 as a function of a ratio $N_o/N_i$, wherein $V_i$ represents the input voltage, $V_o$ represents the output voltage, $N_o$ represents the number of the fingers included in the electrodes $(112B)_3$ and $(113B)_3$, and $N_i$ represents the total number of the fingers included in the electrodes 112A, 113A, $(112B)_1$, $(113B)_1$, $(112B)_2$ and $(113B)_2$. As can be seen in FIG. 49, one can achieve the desired step-up/step-down by changing the parameter $N_i/N_o$.

Further, FIG. 50 shows the step-up/step-down ratio $V_i/V_o$ as a function of the load resistance $R_L$ for the case of the device of FIGS. 44(A) and 44(B), wherein the continuous line represents the theoretical prediction based upon a loss-free model while the solid dots represent the result of experiment. In the device of the present embodiment, an excellent agreement is achieved between the theoretical prediction and the experiment even in the range where the load resistance is very small.

In the device of the present embodiment, in order to improve the dielectric strength of the device between the input electrode and the output electrode, it is preferable to provide a small area S between the edge 111a of the substrate and the finger electrode 112f forming the interdigital electrode at the longitudinal edge as shown in FIG. 51. Such an area S may be formed by reducing the width of the finger electrode 112f. Thereby, one can reduce the electric flux extending from the input electrode to output electrode via the air, and the dielectric strength of the device increases substantially.

In the device of the present embodiment, it is also preferable to reduce the width of the finger electrode in one of the upper and lower major surfaces as shown in FIG. 52, wherein FIG. 52 shows a case where the finger electrode 112A on the upper major surface has a reduced width $w_2$ as compared with the width $w_1$ on the lower major surface. Thereby, the capacitance formed between the two finger electrodes opposing with each other across the piezoelectric substrate is reduced substantially.

Further, the feature of providing the finger electrodes 112f or 113f in correspondence to each of the waves forming a standing wave in the piezoelectric substrate 111 as shown in FIG. 45(B) is not essential particularly when there is provided a fixture at the longitudinal edges of the substrate 111 for preventing reflection of the elastic wave. In such a case, the finger electrodes are provided with a pitch corresponding to the period of the waves that travel through the substrate 111 in the longitudinal direction.

FIG. 53 shows a d.c./a.c. converter wherein the piezoelectric transformer of the present embodiment is used, and FIG. 54 shows the waveform of the output voltage obtained from the circuit of FIG. 53. From FIG. 54, it will be noted that the output voltage has a smooth waveform indicating reduced distortion.

Further, the present invention is not limited to the embodiments described heretofore, but various variations and modifications may be made without departing from the scope of the invention.

What is claimed is:

1. A piezoelectric transformer supplied with an input a.c. voltage and for producing an output a.c. voltage in response thereto, comprising:
   a piezoelectric substrate having upper and lower major surfaces, said substrate extending in a longitudinal direction from a first longitudinal edge to a second, opposite longitudinal edge and in a lateral direction from a first lateral edge to a second, opposite lateral edge;
   first electrode means provided on said upper major surface of said piezoelectric substrate, said first electrode means being supplied with said input a.c. voltage for causing an excitation of an elastic wave in said substrate such that said elastic wave propagates through said substrate in said longitudinal direction, said first electrode means having a periodical structure in said longitudinal direction with a pitch corresponding to a wavelength of said elastic wave; and
   second electrode means provided on said lower major surface of said piezoelectric substrate, for producing said output a.c. voltage by converting said elastic wave into an electric voltage, said second electrode means having a periodical structure in said longitudinal direction with a pitch corresponding to said wavelength of said elastic wave.

2. A piezoelectric transformer as claimed in claim 1, wherein said first electrode means excites said elastic wave such that said elastic wave causes an elastic displacement in said substrate in a plane defined by said longitudinal direction and said lateral direction.

3. A piezoelectric transformer as claimed in claim 1, wherein said first electrode means is provided on said substrate to cover said upper major surface substantially from said first longitudinal edge to said second longitudinal edge.

4. A piezoelectric transformer as claimed in claim 1, wherein said first electrode means comprises a plurality of finger electrodes each extending on said upper major surface of said substrate in said lateral direction, said plurality of finger electrodes of said first electrode means including a first electrode and a second electrode repeated alternately in said longitudinal direction substantially from said first longitudinal edge to said second longitudinal edge, said first electrodes and second electrodes being repeated respectively with a pitch corresponding to said wavelength of said elastic wave, each of said first electrodes being connected commonly with each other electrically such that said first electrodes are energized simultaneously with a first polarity when said input a.c. voltage is applied to said first electrode means, each of said second electrodes being connected commonly with each other electrically such that said second electrodes are excited simultaneously with a second, opposite polarity when said input a.c. voltage is applied to said first electrode means: and
   said second electrode means comprises a plurality of finger electrodes each extending on said lower major surface of said substrate in said lateral direction, said plurality of finger electrodes of said second electrode means including a third electrode and a fourth electrode repeated alternately in said longitudinal direction, said third electrodes and said fourth electrodes being repeated respectively with a pitch corresponding to said wavelength of said elastic wave, each of said third electrodes being connected commonly with each other electrically for producing said output a.c. voltage with a first polarity in response to an excitation by said elastic wave, each of said fourth electrodes being connected commonly with each other electrically for producing said output a.c. voltage in response to an excitation by said elastic wave with a second, opposite polarity.

5. A piezoelectric transformer as claimed in claim 4, wherein said substrate has a size in said longitudinal direction such that said elastic wave, excited in said substrate in response to said input a.c. voltage, establishes a standing wave, wherein said first and second electrodes in the first electrode means and said third and fourth electrodes of said second electrode means are provided in correspondence to a node of said standing wave.

6. A piezoelectric transformer as claimed in claim 5, wherein said first electrode means includes said first and second electrodes in a first number, said second electrode means includes said third and fourth electrodes in a second number, wherein said first number is different from said second number.

7. A piezoelectric transformer as claimed in claim 6, wherein said piezoelectric transformer further comprises third electrode means that in turn comprises a plurality of finger electrodes on said lower major surface of said substrate such that each of said finger electrodes extends in said lateral direction, said finger electrodes of said third electrode means including fifth and sixth electrodes provided alternately in said longitudinal direction, said fifth electrodes and sixth electrodes being repeated respectively with a pitch corresponding to said wavelength of said elastic wave excited in said substrate, wherein said fifth electrodes are connected commonly with each other electrically for receiving said input a.c. voltage with a first polarity, and said sixth electrodes are connected commonly with each other electrically for receiving said input a.c. voltage with a second, opposite polarity.

8. A piezoelectric transformer as claimed in claim 7, wherein said second electrode means and said third electrode means are provided on said lower major surface of said substrate such that said lower major surface is covered substantially by said second electrode means and said third electrode means from said first longitudinal edge to said second longitudinal edge.

9. A piezoelectric transformer as claimed in claim 4, wherein each of said first and second electrodes has a width, measured in said longitudinal direction of said substrate, that is reduced with respect to a width of said third and fourth electrodes.

10. An apparatus supplied with an input signal, comprising:
 a piezoelectric substrate extending in a longitudinal direction;
 a first plurality of electrodes arranged along the longitudinal direction on the piezoelectric substrate, having a first pitch based on a wavelength of the input signal, causing an elastic wave to be generated in the piezoelectric substrate upon receipt of the input signal; and
 a second plurality of electrodes arranged along the longitudinal direction on the piezoelectric substrate, having a second pitch based on the wavelength of the input signal, generating an output signal based on the elastic wave.

* * * * *